(12) United States Patent
Huang et al.

(10) Patent No.: US 12,211,924 B2
(45) Date of Patent: Jan. 28, 2025

(54) SEMICONDUCTOR DEVICE AND METHOD OF FORMING THE SAME

(71) Applicant: TAIWAN SEMICONDUCTOR MANUFACTURING COMPANY, LTD., Hsinchu (TW)

(72) Inventors: Yu-Lien Huang, Hsinchu County (TW); Tze-Liang Lee, Hsinchu (TW); Jr-Hung Li, Hsinchu County (TW); Chi-Hao Chang, Taoyuan (TW); Bor Chiuan Hsieh, Taoyuan (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 428 days.

(21) Appl. No.: 17/547,072

(22) Filed: Dec. 9, 2021

(65) Prior Publication Data

US 2023/0187530 A1   Jun. 15, 2023

(51) Int. Cl.
*H01L 21/768* (2006.01)
*H01L 21/8234* (2006.01)
*H01L 29/66* (2006.01)
*H01L 29/78* (2006.01)

(52) U.S. Cl.
CPC .......... *H01L 29/66545* (2013.01); *H01L 21/823418* (2013.01); *H01L 21/823431* (2013.01); *H01L 21/823468* (2013.01); *H01L 29/6656* (2013.01); *H01L 29/66795* (2013.01); *H01L 29/7851* (2013.01)

(58) Field of Classification Search
None
See application file for complete search history.

(56) References Cited

U.S. PATENT DOCUMENTS

| | | |
|---|---|---|
| 9,105,490 B2 | 8/2015 | Wang et al. |
| 9,236,267 B2 | 1/2016 | De et al. |
| 9,236,300 B2 | 1/2016 | Liaw |
| 9,406,804 B2 | 8/2016 | Huang et al. |
| 9,443,769 B2 | 9/2016 | Wang et al. |
| 9,520,482 B1 | 12/2016 | Chang et al. |
| 9,548,366 B1 | 1/2017 | Ho et al. |
| 9,576,814 B2 | 2/2017 | Wu et al. |
| 9,831,183 B2 | 11/2017 | Lin et al. |
| 9,859,386 B2 | 1/2018 | Ho et al. |
| 2017/0352744 A1* | 12/2017 | Basker ............ H01L 21/3065 |
| 2020/0111880 A1* | 4/2020 | Wang ............ H01L 29/41791 |
| 2020/0144118 A1* | 5/2020 | Cheng ............ H01L 21/76831 |

* cited by examiner

*Primary Examiner* — Joseph C. Nicely
*Assistant Examiner* — Lamont B Koo
(74) *Attorney, Agent, or Firm* — Maschoff Brennan

(57) ABSTRACT

A method of forming a semiconductor device includes forming a dummy gate structure across a fin protruding from a substrate, forming gate spacers on opposite sidewalls of the dummy gate structure, forming source/drain epitaxial structures on opposite sides of the dummy gate structure, forming a first interlayer dielectric (ILD) layer on the source/drain epitaxial structures and outer sidewalls of the gate spacers, replacing the dummy gate structure with a replacement gate structure, etching back the replacement gate structure to form a recess between the gate spacers, performing a first non-conformal deposition process to fill the recess with a first gate cap material, and planarizing the first gate cap material to remove a portion of the first gate cap material outside the recess.

20 Claims, 32 Drawing Sheets

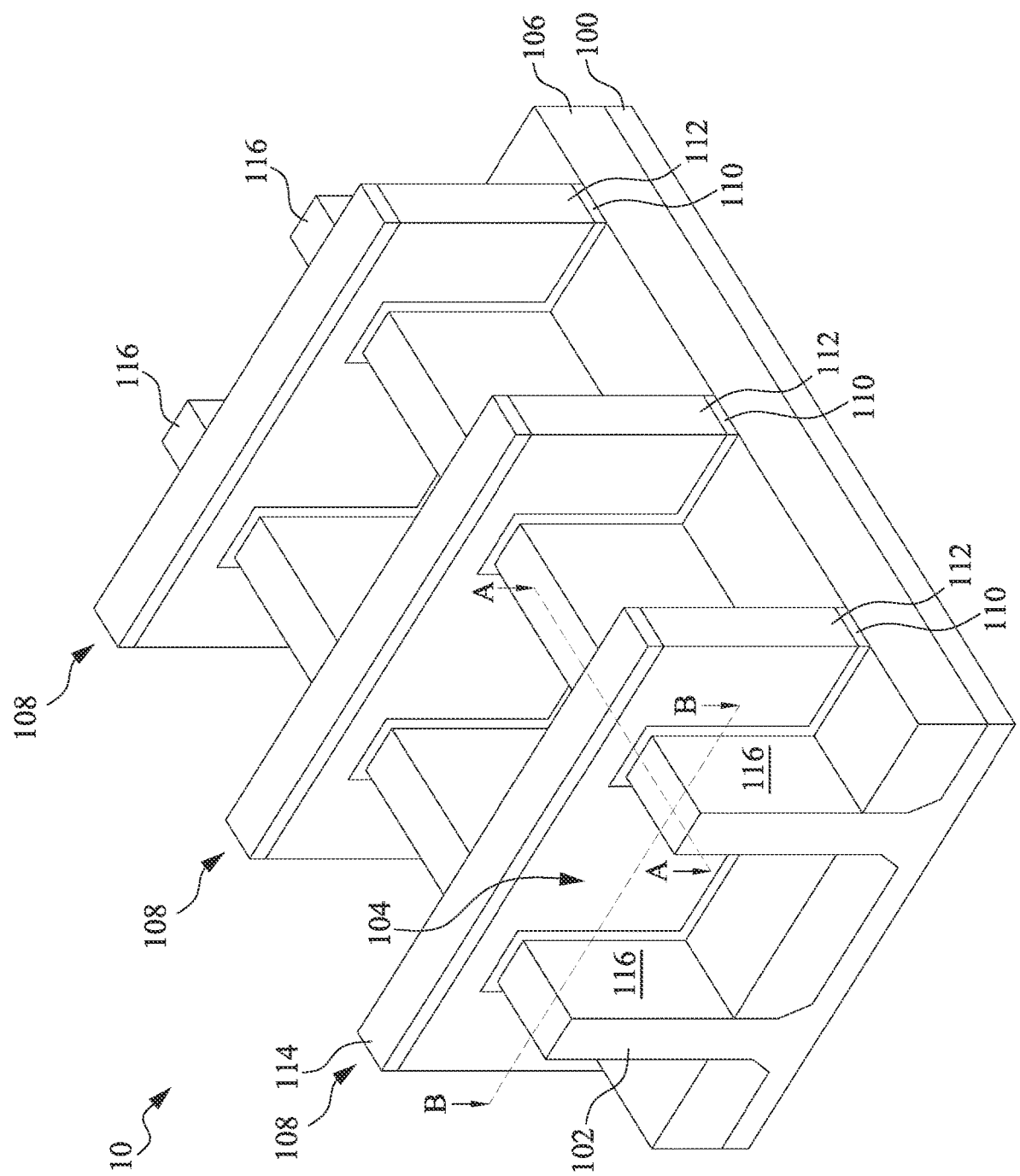

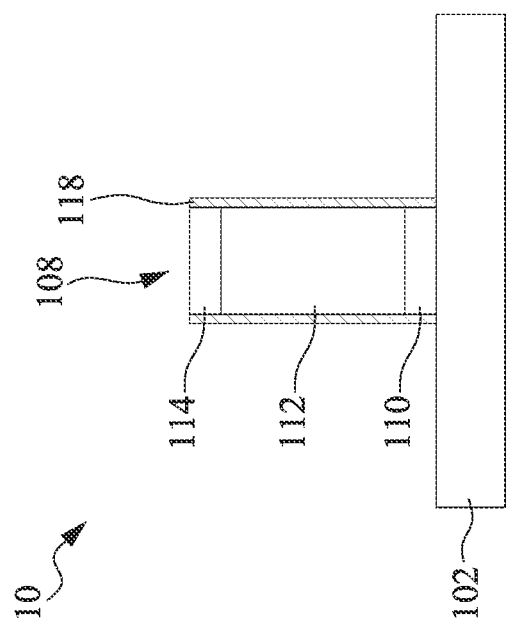

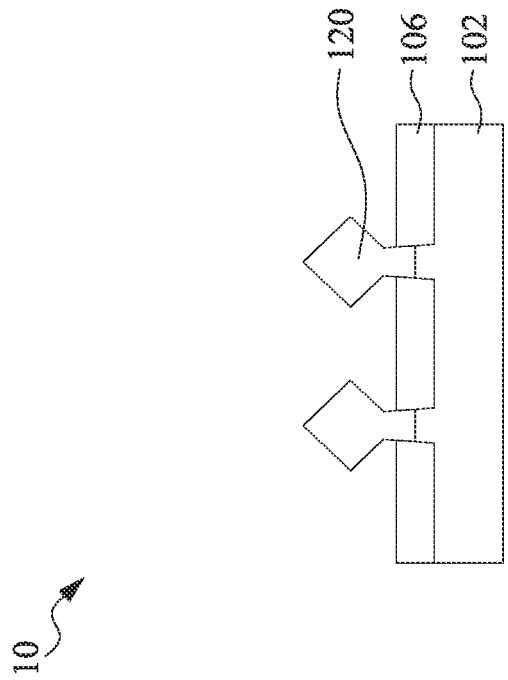
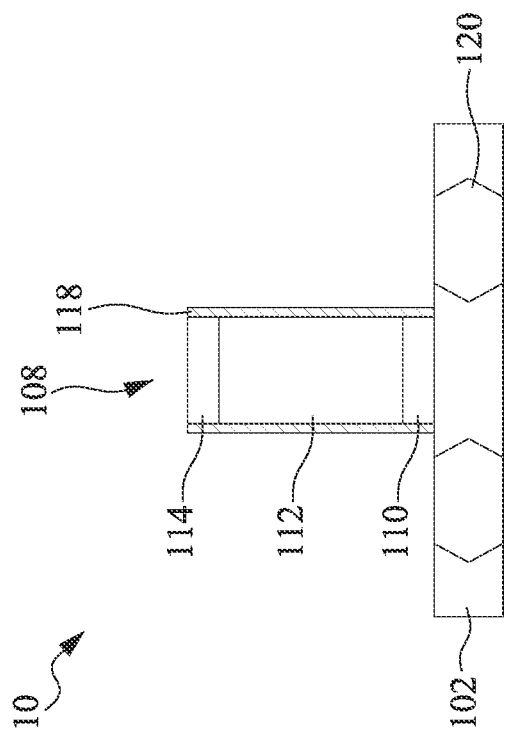
Fig. 3A
Fig. 3B

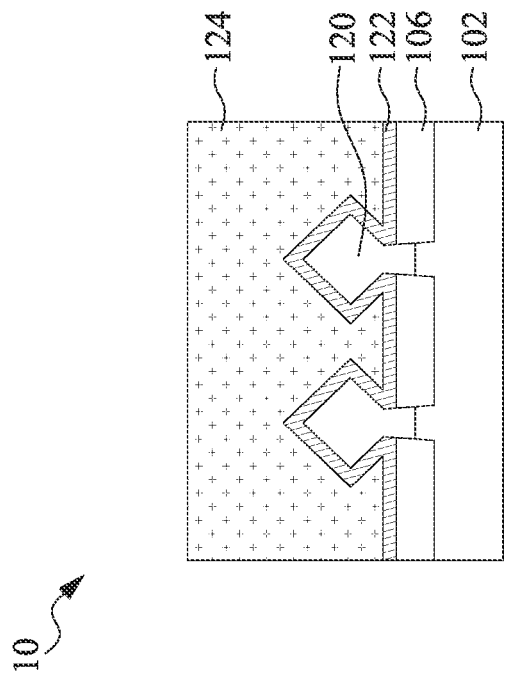
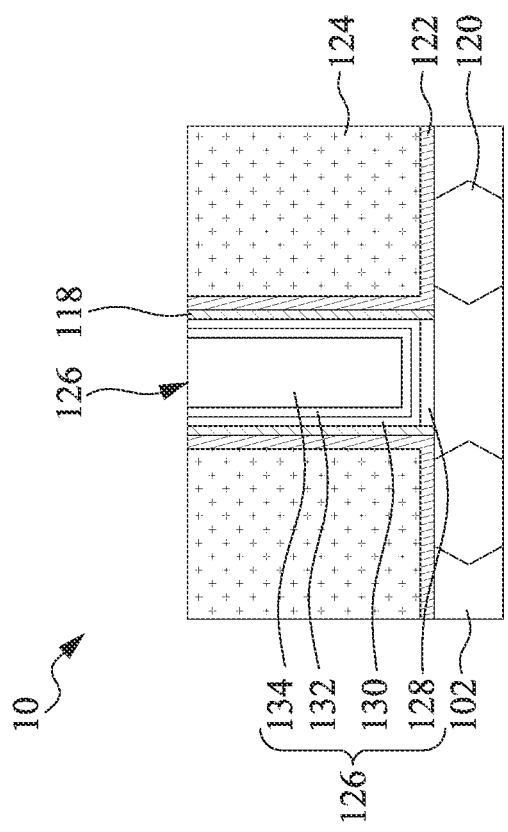

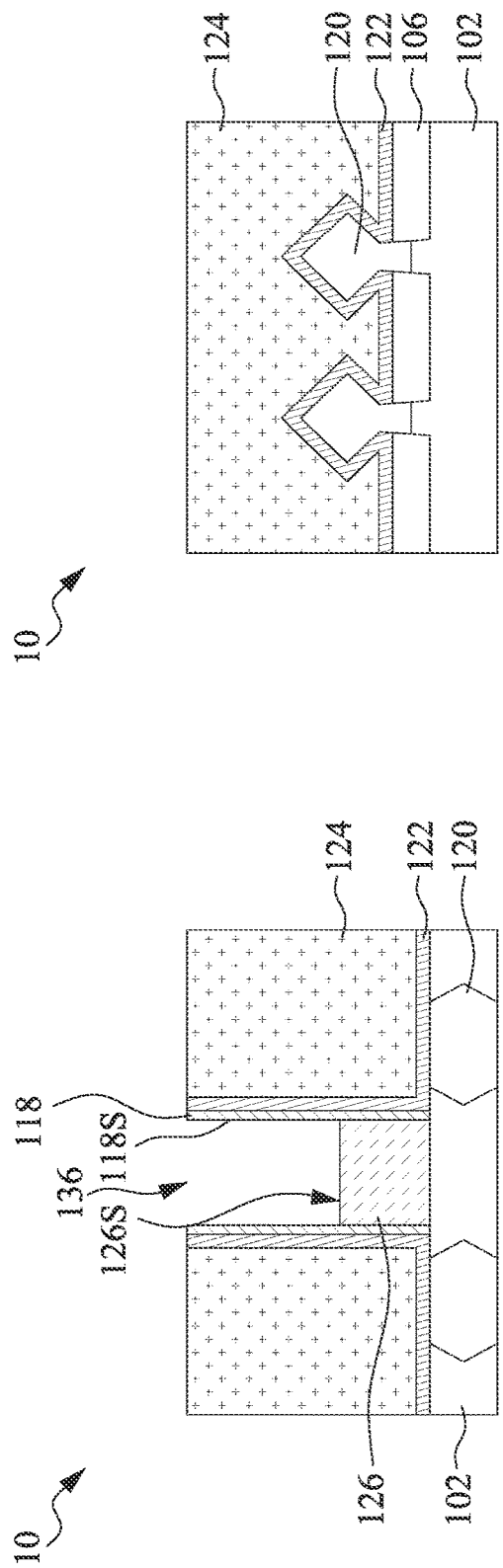
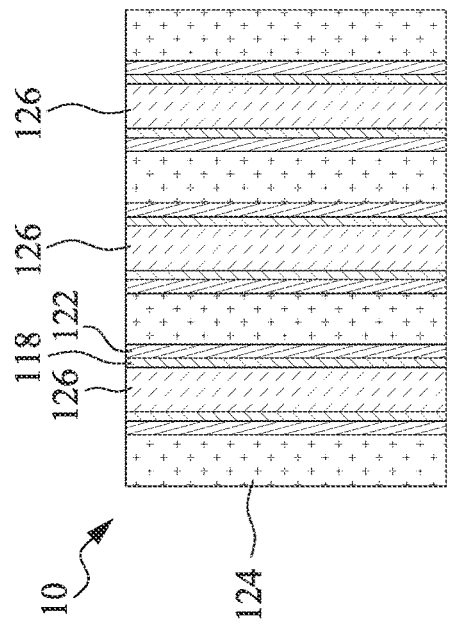
Fig. 5A
Fig. 5B
Fig. 5C

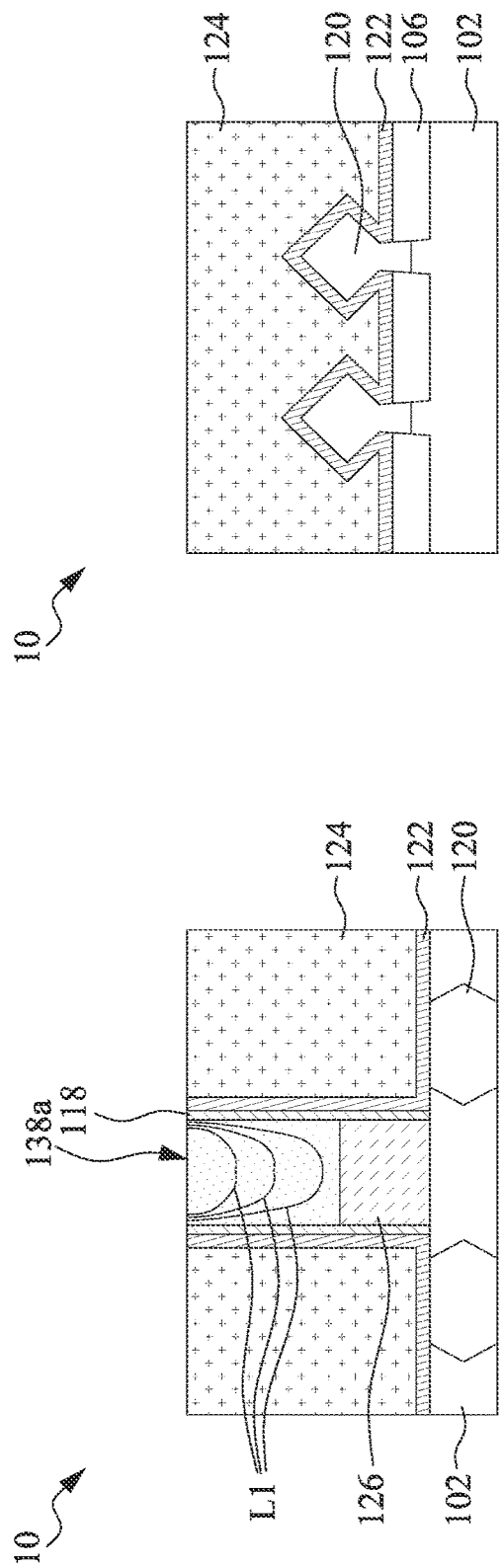
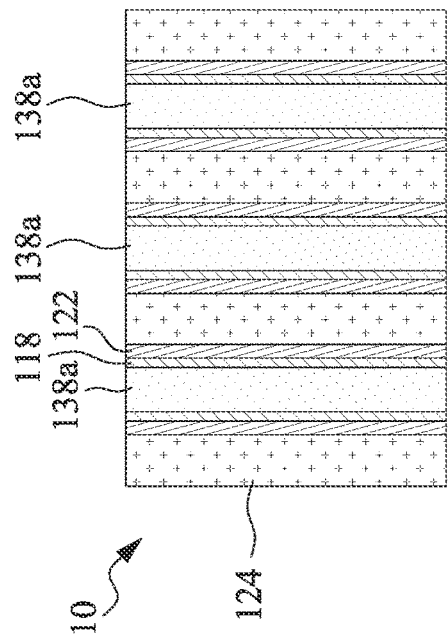
Fig. 7A
Fig. 7B
Fig. 7C

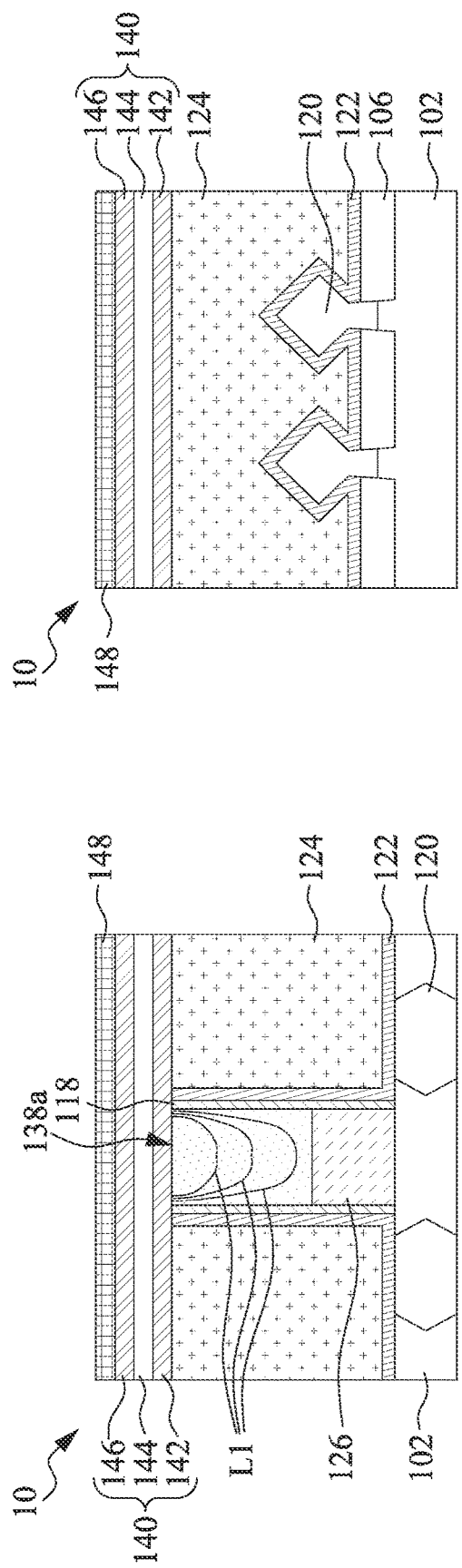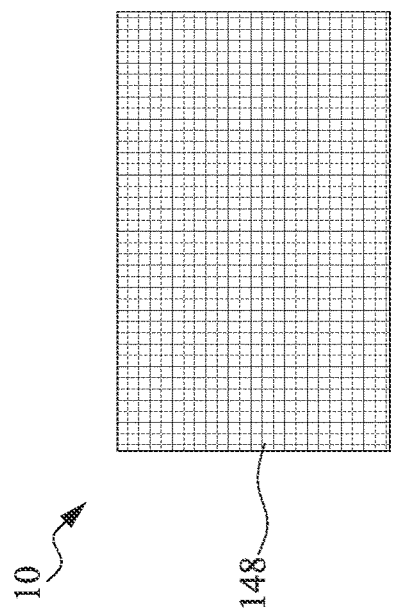

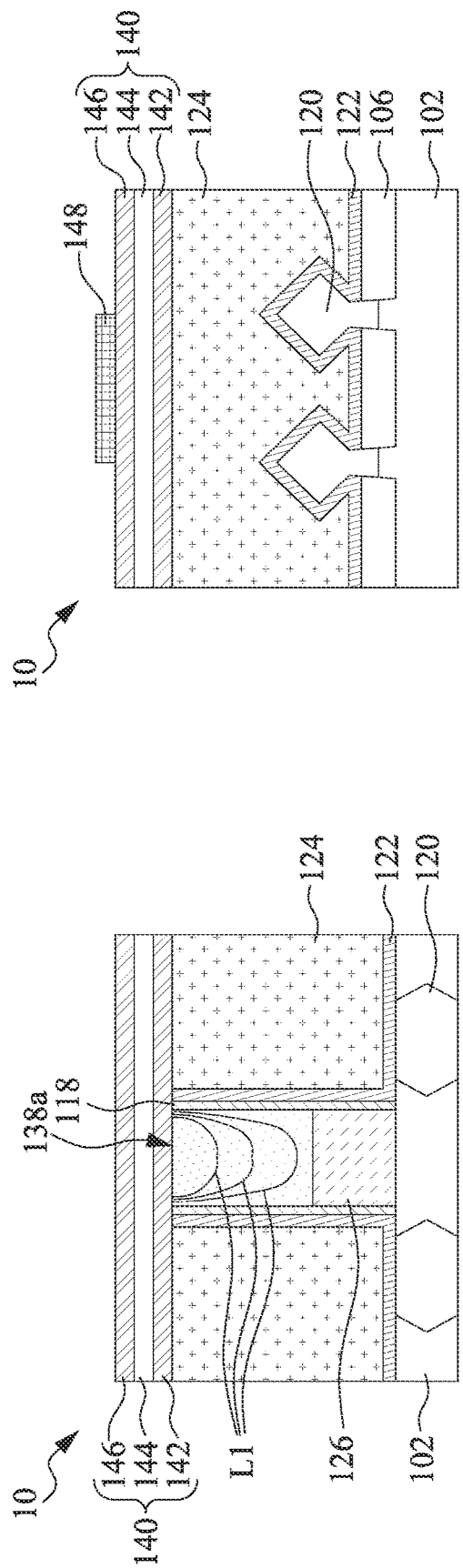
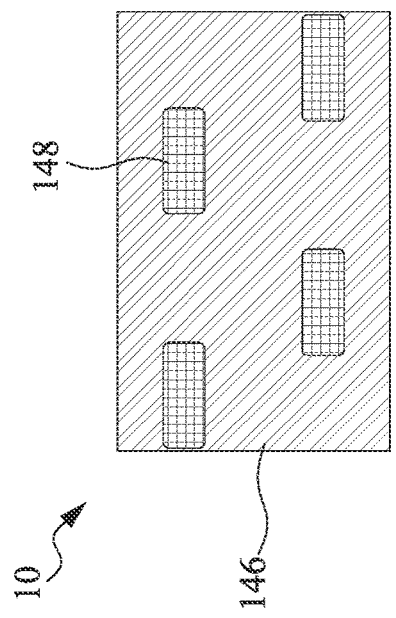
Fig. 10A
Fig. 10B
Fig. 10C

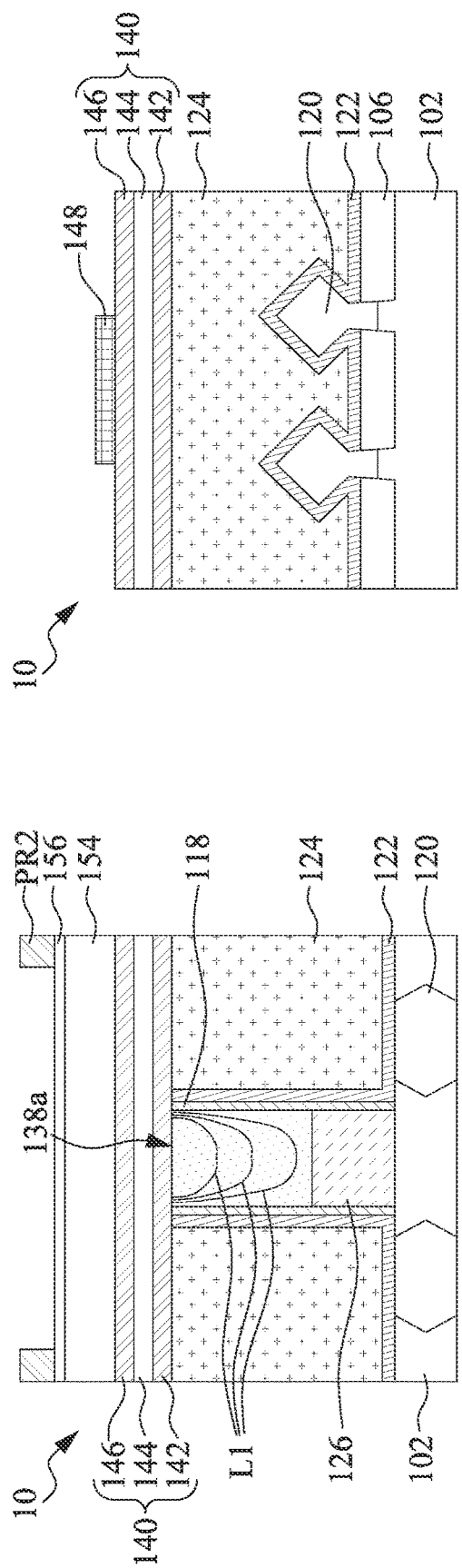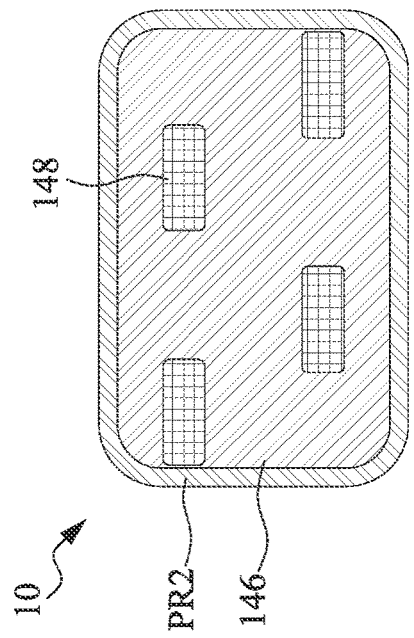
Fig. 11A
Fig. 11B
Fig. 11C

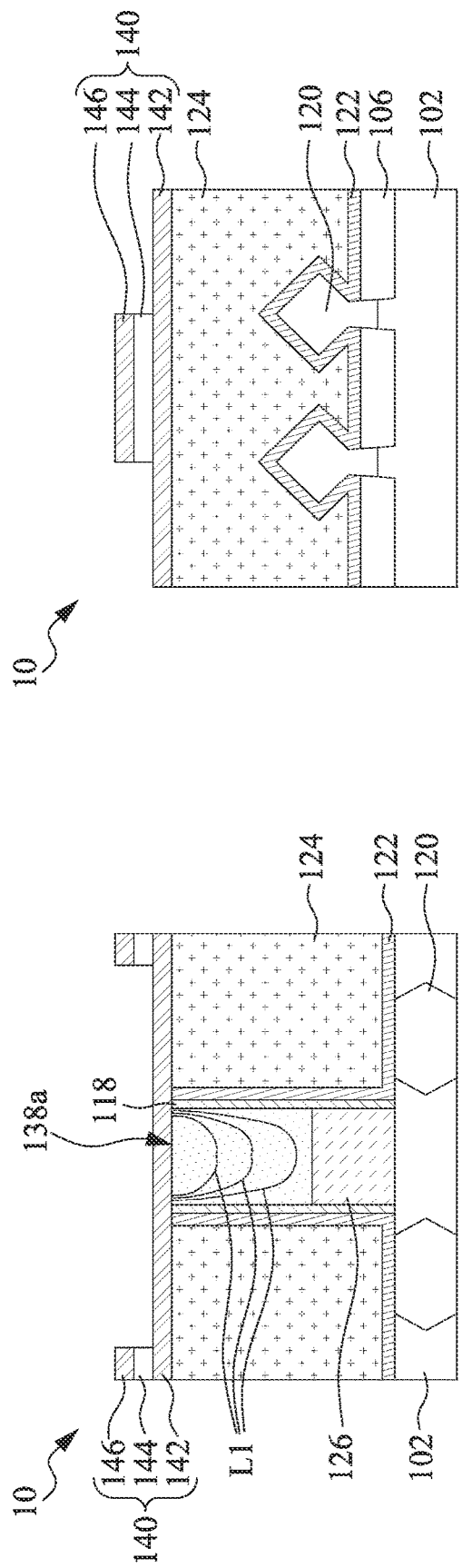
Fig. 12A
Fig. 12B
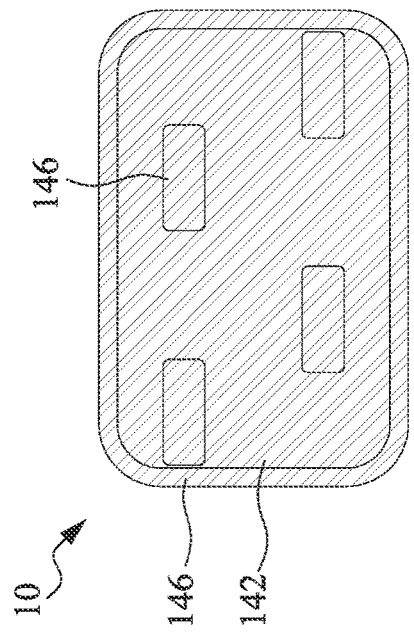
Fig. 12C

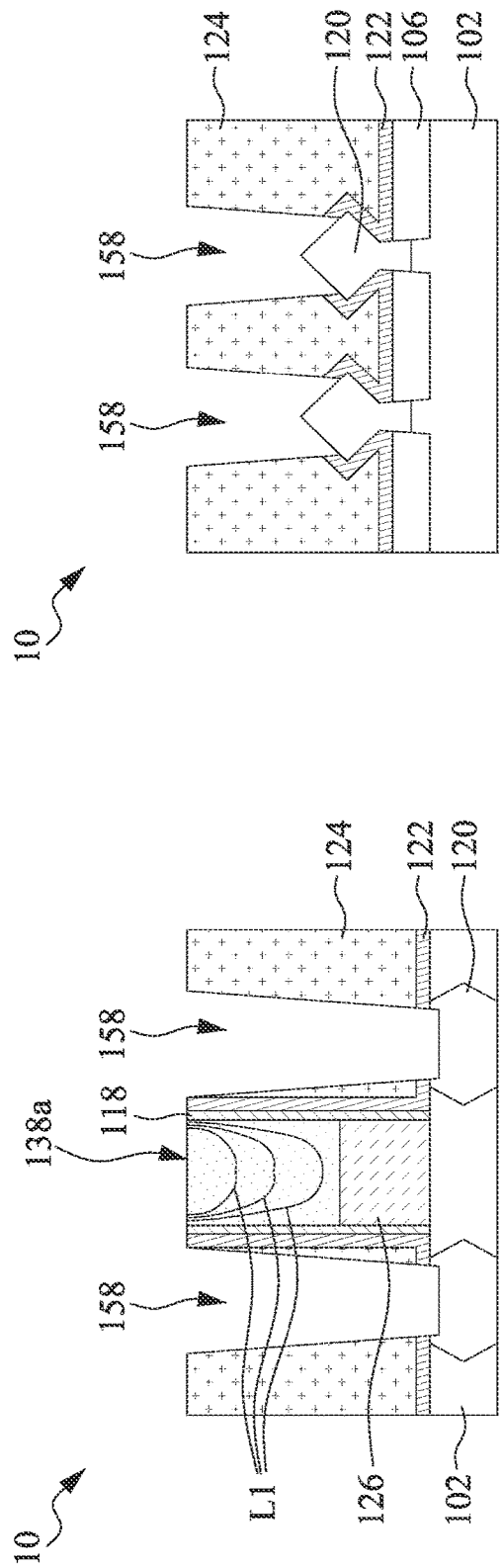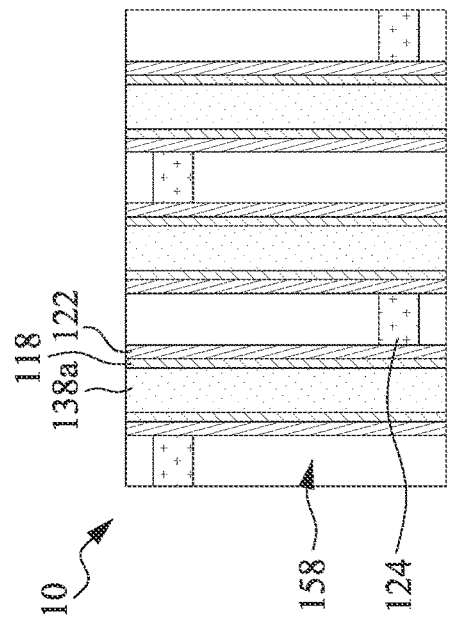
Fig. 13A
Fig. 13B
Fig. 13C

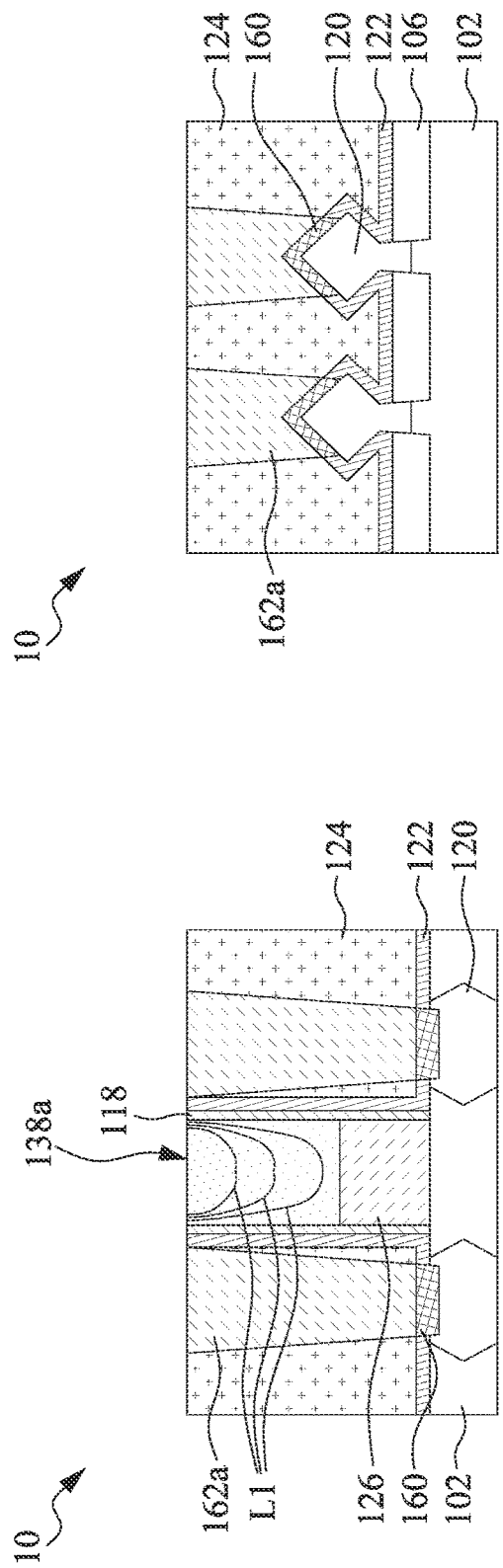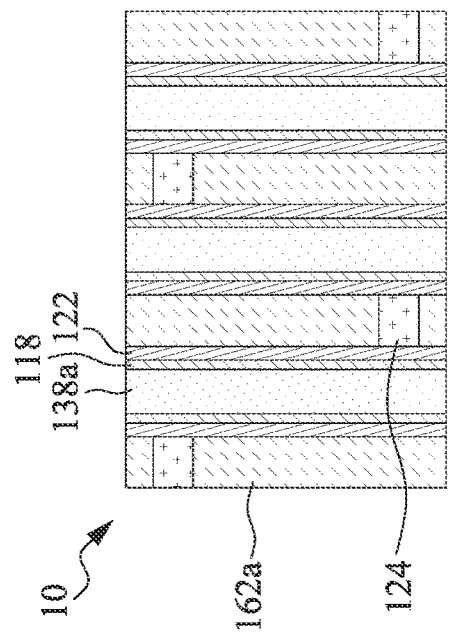

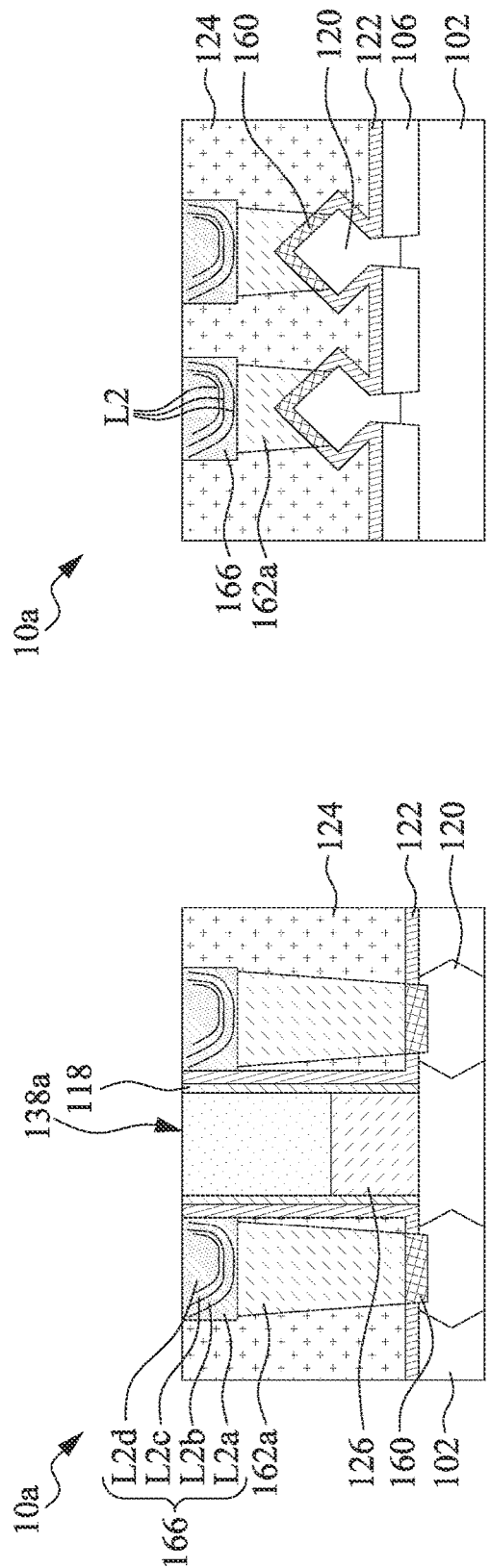
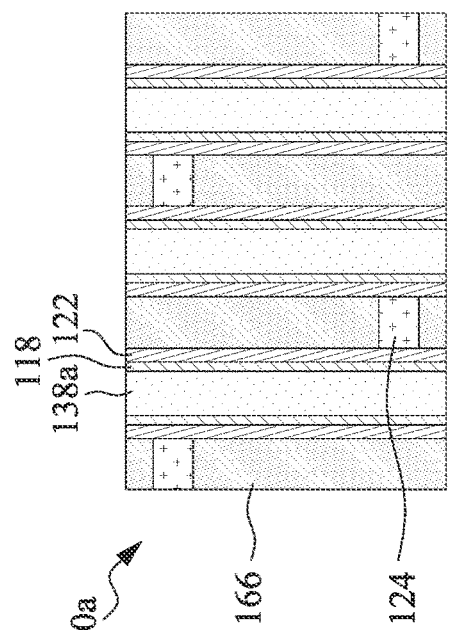
Fig. 18A
Fig. 18B
Fig. 18C

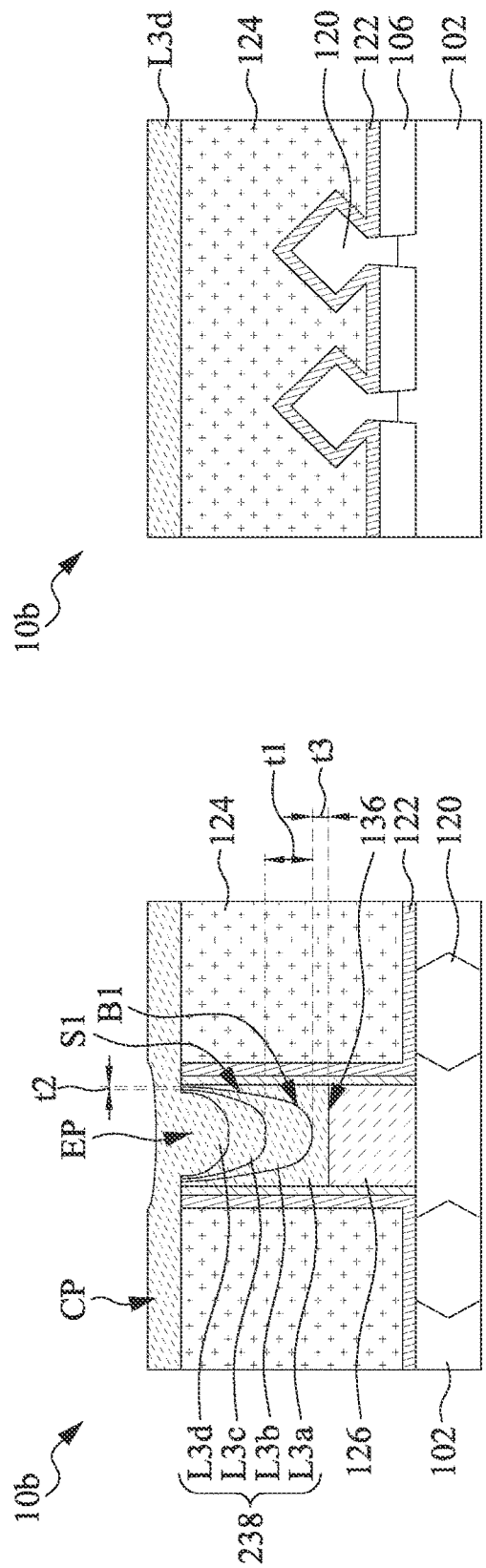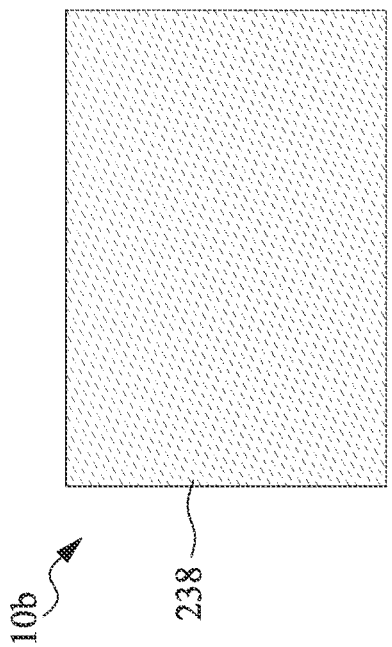
Fig. 20A
Fig. 20B
Fig. 20C

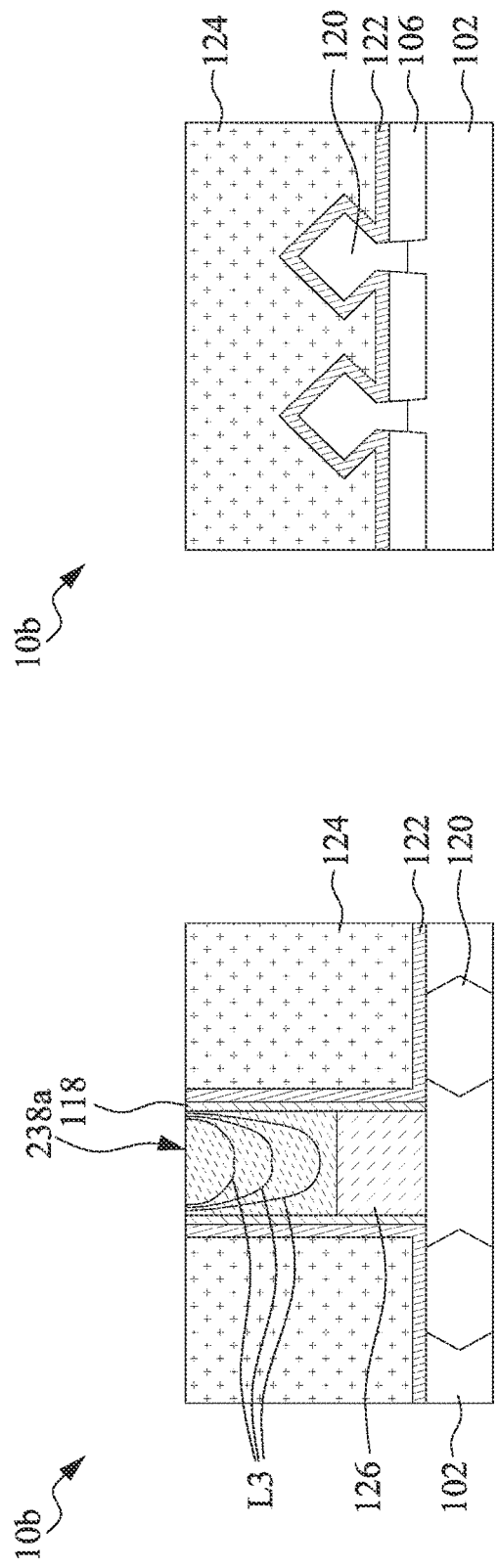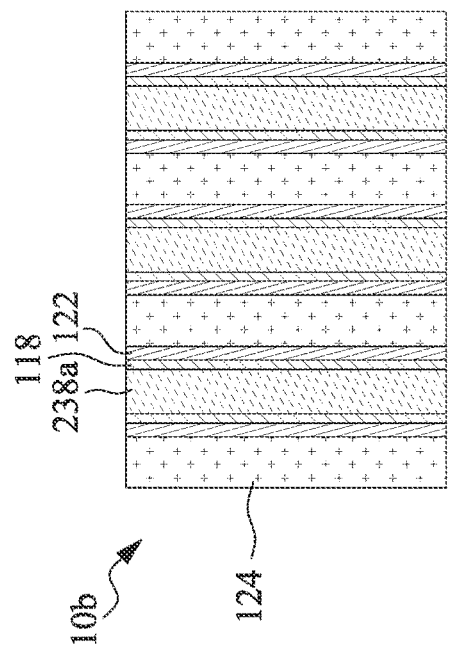
Fig. 21A
Fig. 21B
Fig. 21C

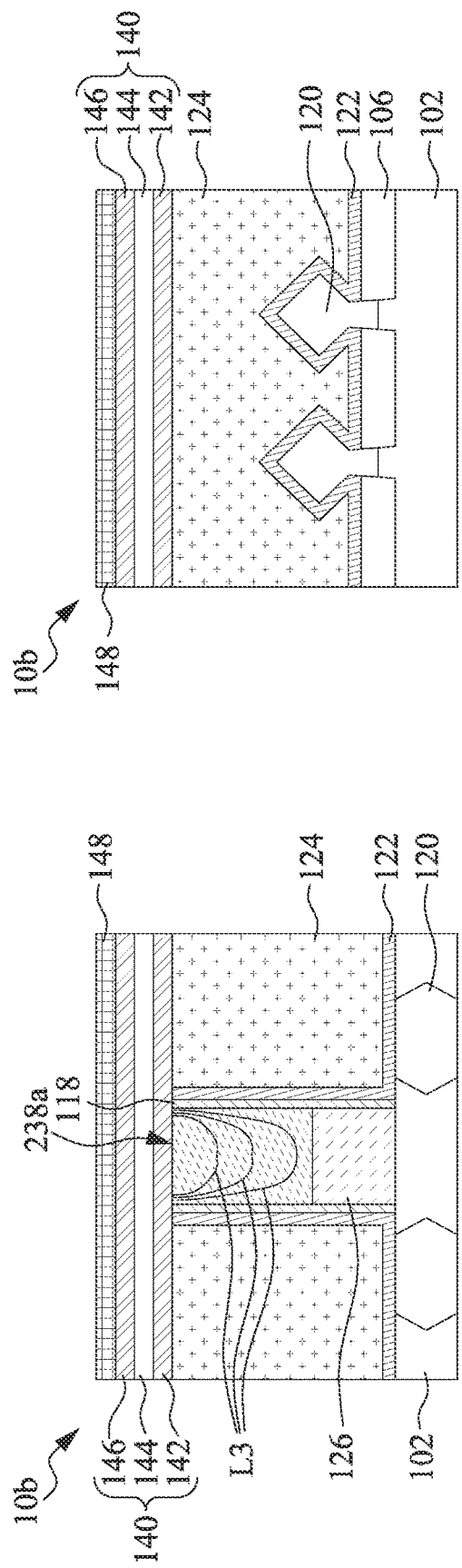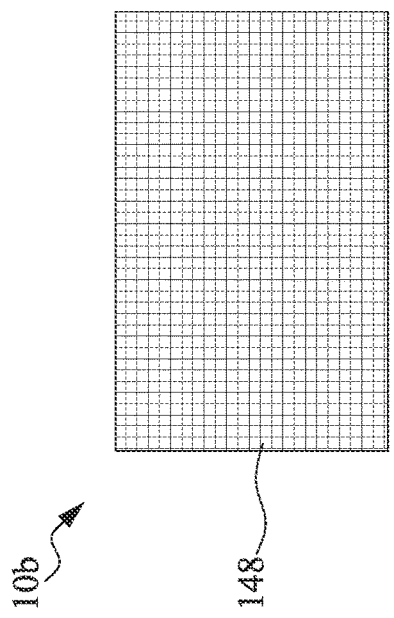
Fig. 22A
Fig. 22B
Fig. 22C

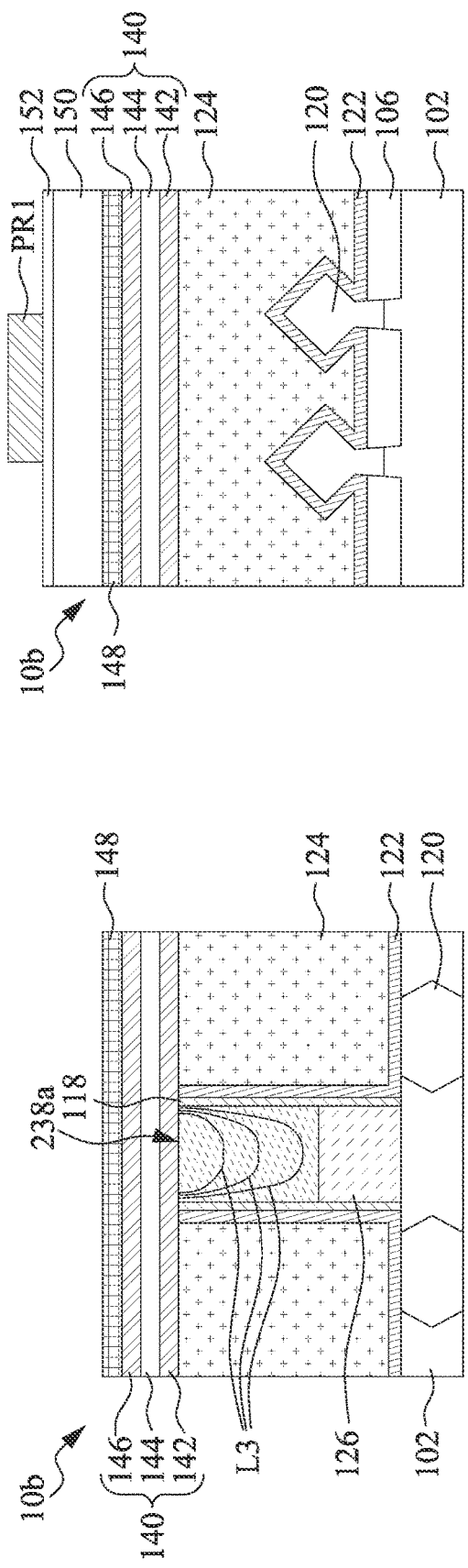
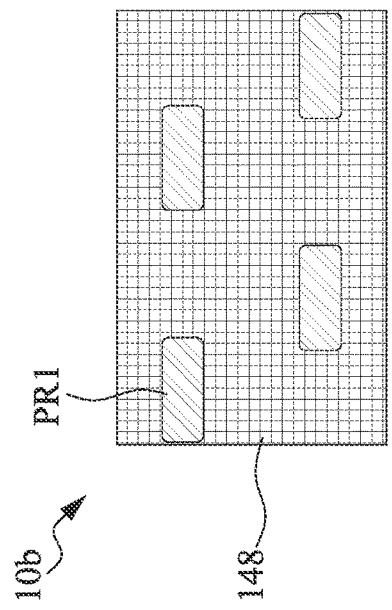
Fig. 23A
Fig. 23B
Fig. 23C

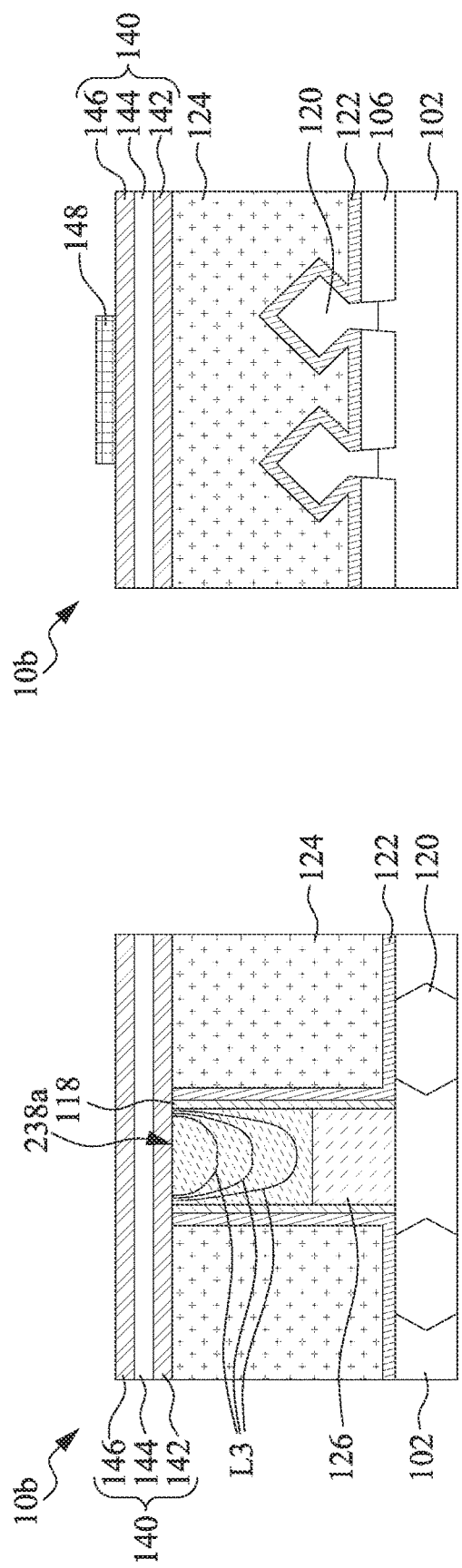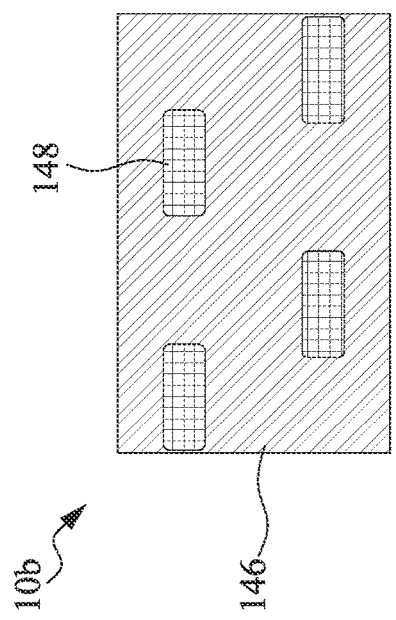
Fig. 24A
Fig. 24B
Fig. 24C

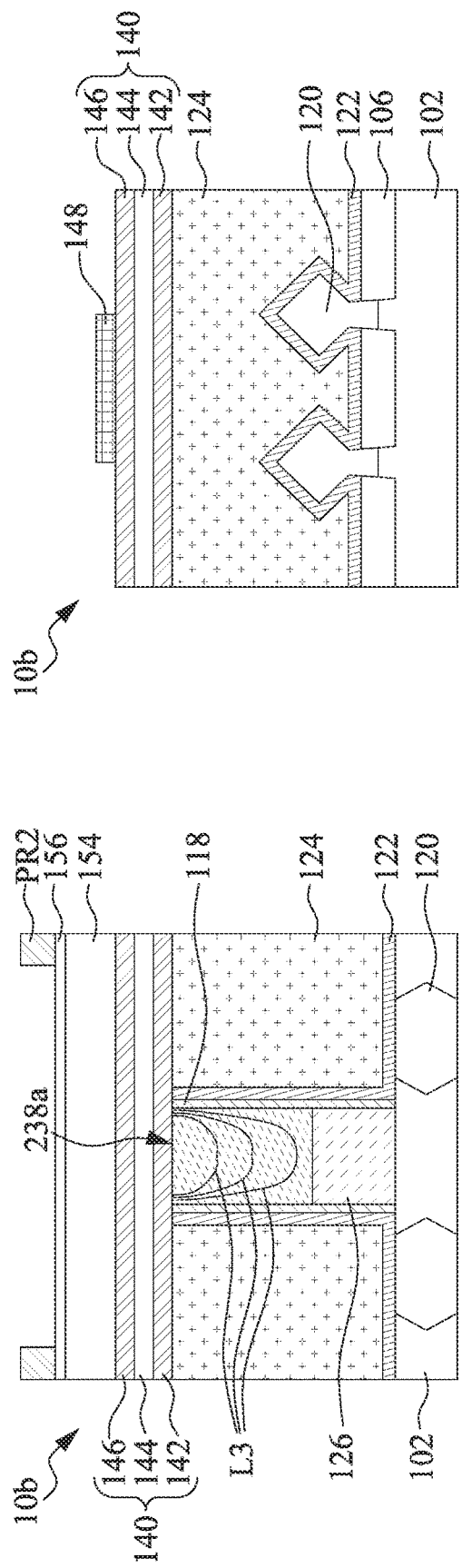
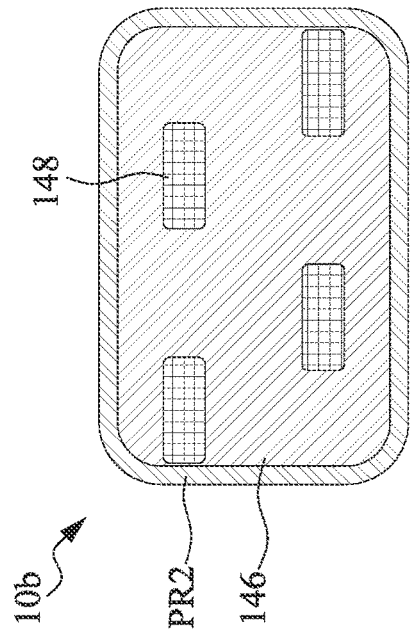
Fig. 25A
Fig. 25B
Fig. 25C

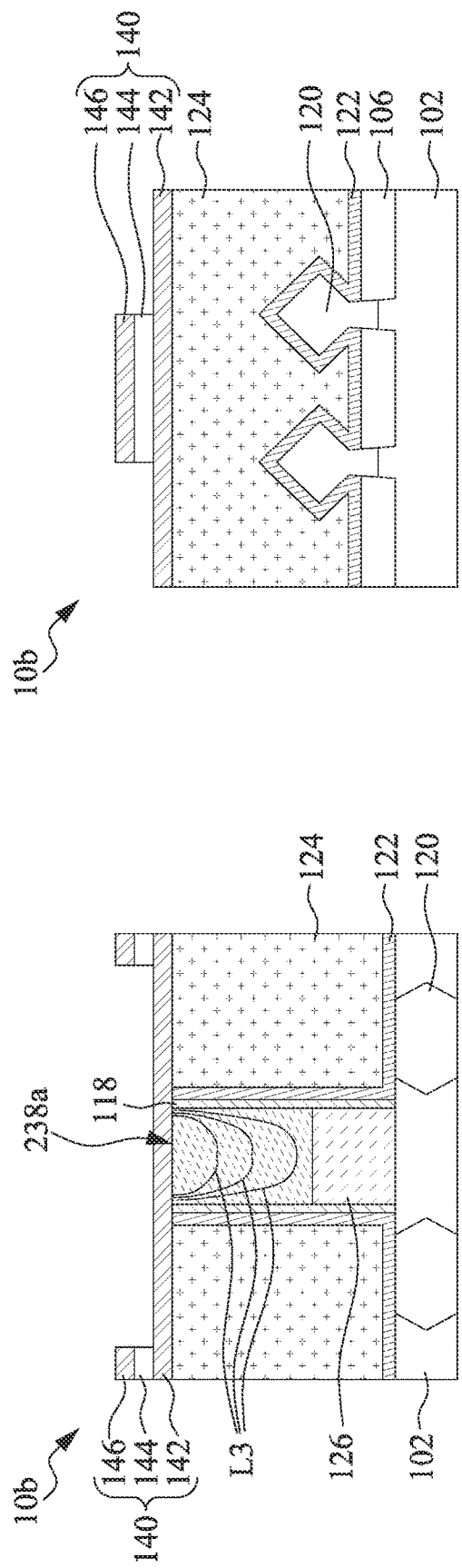

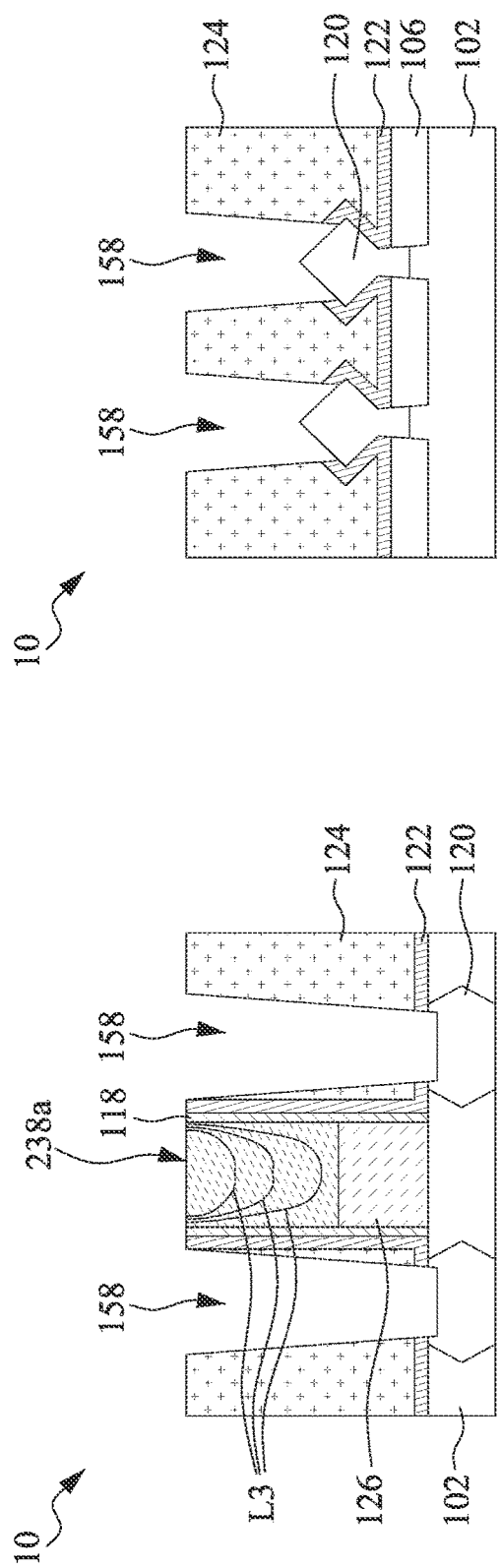
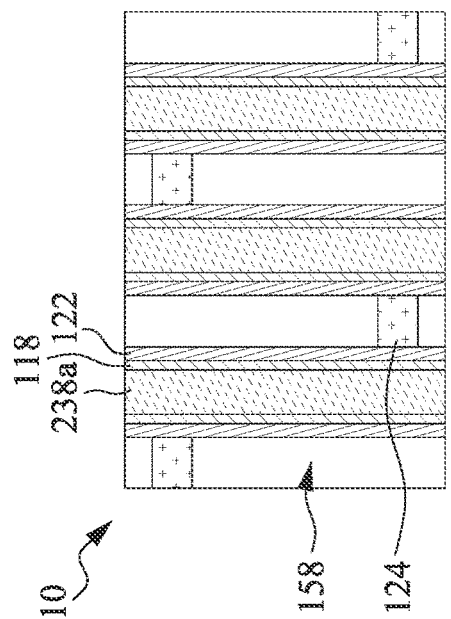
Fig. 27A
Fig. 27B
Fig. 27C

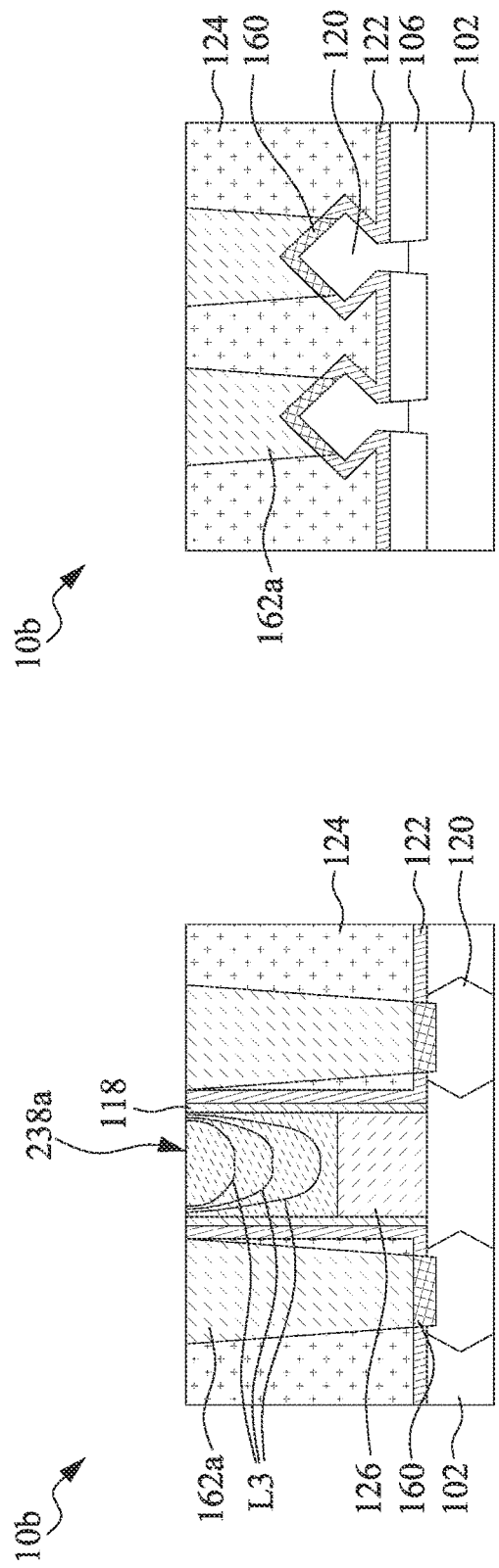
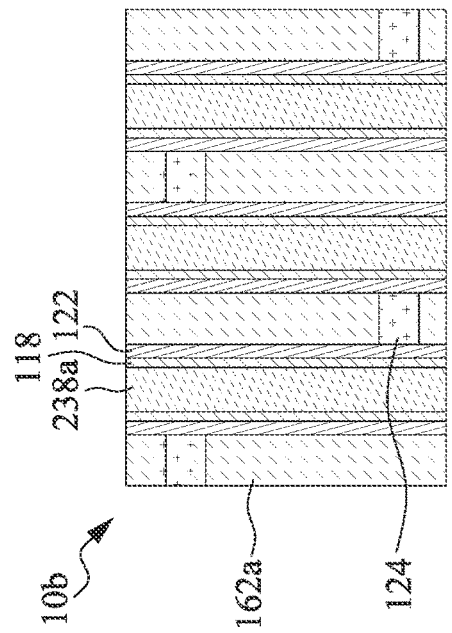
Fig. 29A
Fig. 29B
Fig. 29C

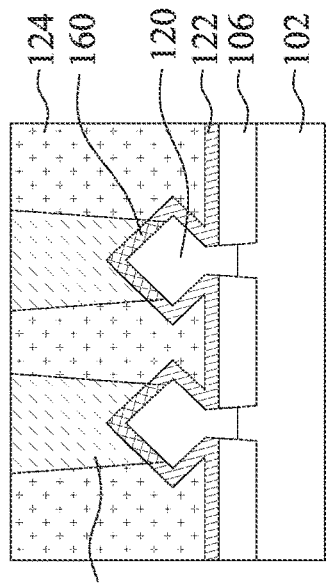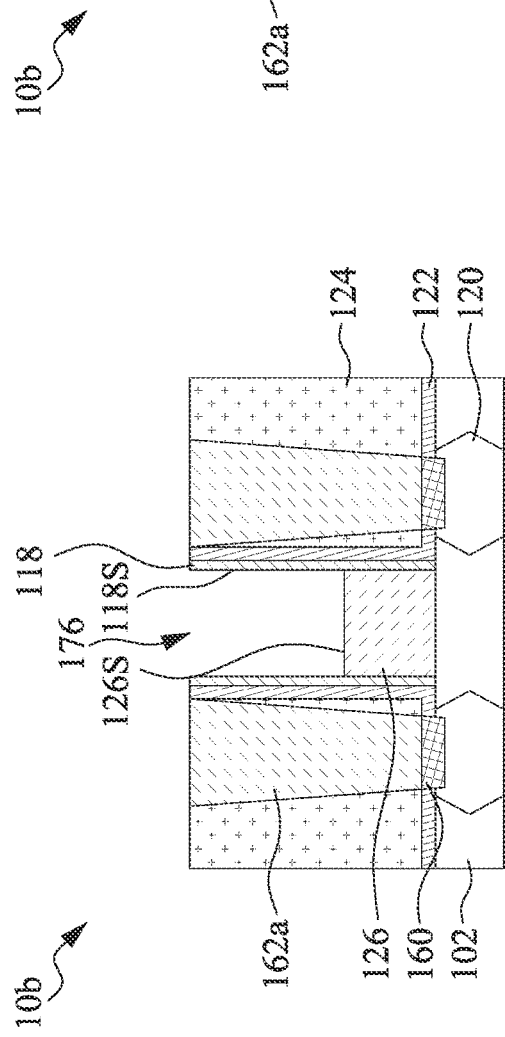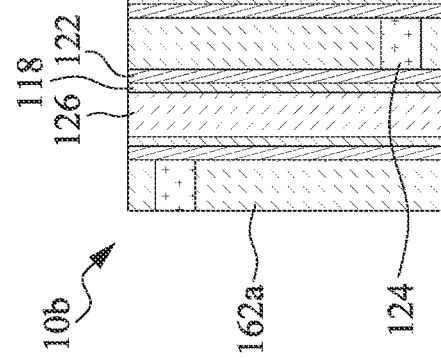

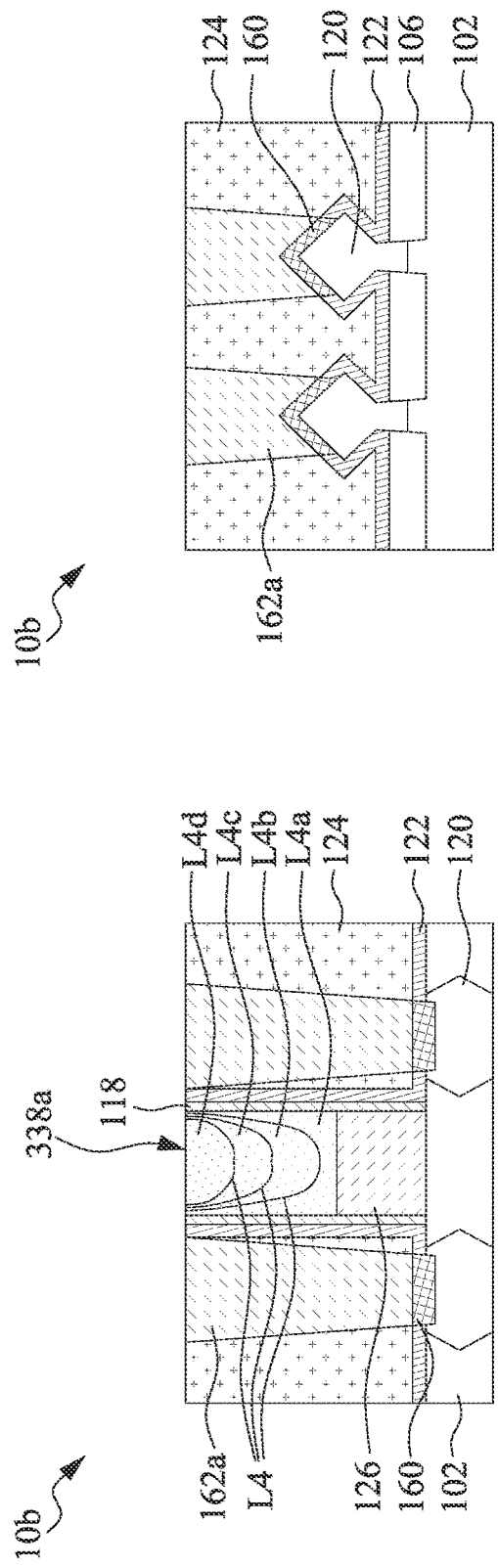
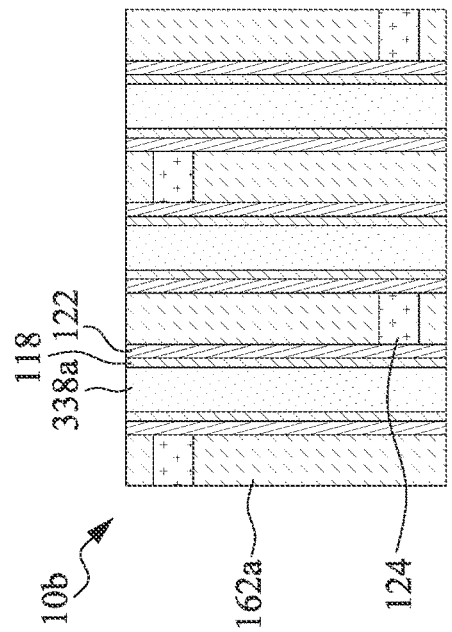
Fig. 31A
Fig. 31B
Fig. 31C

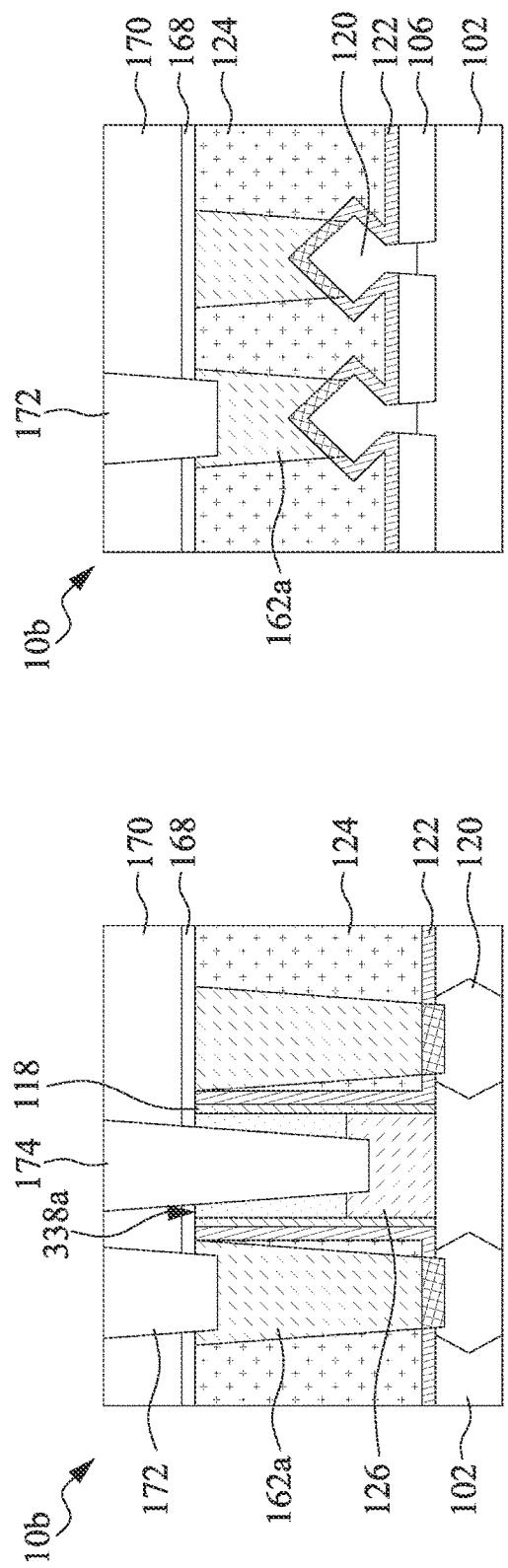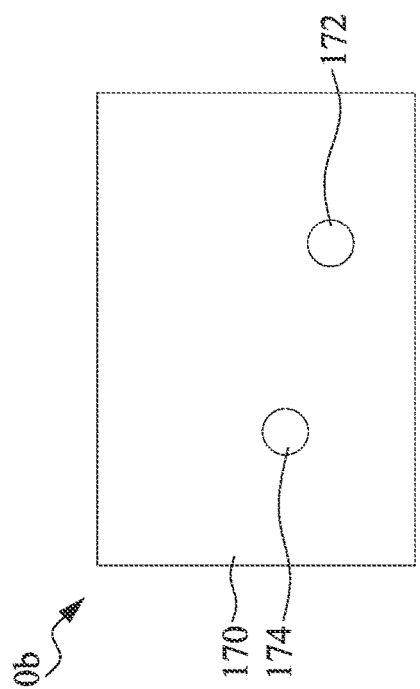

SEMICONDUCTOR DEVICE AND METHOD OF FORMING THE SAME

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advancements to be realized, similar developments in IC processing and manufacturing are needed.

BRIEF DESCRIPTION OF THE DRAWINGS

Aspects of the present disclosure are best understood from the following detailed description when read with the accompanying Figures. It is noted that, in accordance with the standard practice in the industry, various features are not drawn to scale. In fact, the dimensions of the various features may be arbitrarily increased or reduced for clarity of discussion.

FIG. 1 illustrates a perspective view of an example of the semiconductor device in a three-dimensional view corresponding to a stage of fabrication according to some embodiments.

FIGS. 2, 3A, 4A, 5A, 6A, 7A, 8A, 9A, 10A, 11A, 12A, 13A, 14A and 15A are schematic cross-sectional views of respective intermediate structures corresponding to various stages of fabrication and corresponding to cross-section A-A in FIG. 1.

FIGS. 3B, 4B, 5B, 6B, 7B, 8B, 9B, 10B, 11B, 12B, 13B, 14B and 15B are schematic cross-sectional views of respective intermediate structures corresponding to various stages of fabrication and corresponding to cross-section B-B in FIG. 1.

FIGS. 5C, 6C, 7C, 8C, 9C, 10C, 11C, 12C, 13C, 14C and 15C are schematic top views of respective intermediate structures corresponding to various stages of fabrication and corresponding to FIG. 1.

FIGS. 16A, 17A, 18A and 19A are schematic cross-sectional views of respective intermediate structures corresponding to various stages of fabrication and corresponding to cross-section A-A in FIG. 1.

FIGS. 16B, 17B, 18B and 19B are schematic cross-sectional views of respective intermediate structures corresponding to various stages of fabrication and corresponding to cross-section B-B in FIG. 1.

FIGS. 16C, 17C, 18C and 19C are schematic top views of respective intermediate structures corresponding to various stages of fabrication and corresponding to FIG. 1.

FIGS. 20A, 21A, 22A, 23A, 24A, 25A, 26A, 27A, 28A, 29A, 30A, 31A and 32A are schematic cross-sectional views of respective intermediate structures corresponding to various stages of fabrication and corresponding to cross-section A-A in FIG. 1.

FIGS. 20B, 21B, 22B, 23B, 24B, 25B, 26B, 27B, 28B, 29B, 30B, 31B and 32B are schematic cross-sectional views of respective intermediate structures corresponding to various stages of fabrication and corresponding to cross-section B-B in FIG. 1.

FIGS. 20C, 21C, 22C, 23C, 24C, 25C, 26C, 27C, 28C, 29C, 30C, 31C and 32C are schematic top views of respective intermediate structures corresponding to various stages of fabrication and corresponding to FIG. 1.

DETAILED DESCRIPTION

Figure 6A:
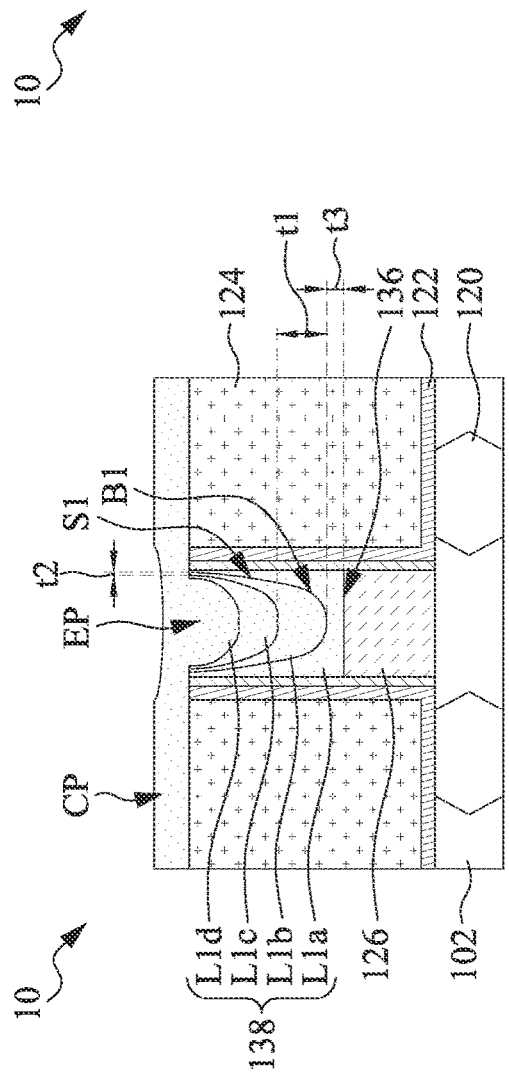

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in contact, and may also include embodiments in which additional features may be formed between the first and second features, such that the first and second features may not be in contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the Figures. The spatially relative terms are intended to encompass different orientations of the device in use or operation in addition to the orientation depicted in the Figures. The apparatus may be otherwise oriented (rotated 90 degrees or at other orientations) and the spatially relative descriptors used herein may likewise be interpreted accordingly.

It is also noted that the present disclosure presents embodiments in the form of multi-gate transistors or fin-type multi-gate transistors referred to herein as fin field-effect transistor (FinFET) devices. Such a device may include a P-type metal-oxide-semiconductor FinFET device or an N-type metal-oxide-semiconductor FinFET device. The FinFET device may be a dual-gate device, tri-gate device, bulk device, silicon-on-insulator (SOI) device, and/or other configuration. One of ordinary skill may recognize other examples of semiconductor devices that may benefit from aspects of the present disclosure. For example, some embodiments as described herein may also be applied to gate-all-around (GAA) devices, Omega-gate (22-gate) devices, or Pi-gate (Π-gate) devices.

FIG. 1 illustrates an example of an intermediate structure of an integrated circuit (IC) structure 10 in a three-dimensional view. FIG. 1 also illustrates reference cross-sections that is used in later figures. Fins 102 are formed on a semiconductor substrate 100. The semiconductor substrate 100 may be or include a bulk semiconductor substrate, a semiconductor-on-insulator (SOI) substrate, or the like, which may be doped (e.g., with a p-type or an n-type dopant) or undoped. In some embodiments, the semiconductor material of the semiconductor substrate 100 may include an elemental semiconductor including silicon (Si) or germanium (Ge); a compound semiconductor; an alloy semiconductor; or a combination thereof. Each fin 102 provides an active area where one or more devices are formed. The fins 102 are fabricated using suitable processes performed on the semiconductor substrate 100, including masking, photolithography, and/or etch processes, to form trenches 104 into the semiconductor substrate 100, leaving the fins extended upward from the semiconductor substrate 100. The fins 102 may be patterned by any suitable method. For example, the fins 102 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins 102 and form the trenches 104.

The trenches 104 may then be filled with an insulating material such as an oxide (e.g., silicon oxide), a nitride, the like, or a combination thereof. The insulating material may be recessed, such as by using an acceptable etch process, to form the isolation regions 106. The insulating material is recessed such that the fins 102 protrude above and from between neighboring isolation regions 106.

Dummy gate structures 108 are formed on the fins 102. The dummy gate structures 108 are over and extend perpendicularly to the fins 102. Each dummy gate structure 108 includes an interfacial dielectric 110, a dummy gate 112 over the interfacial dielectric 110, and a mask 114 over the dummy gate 112. The interfacial dielectrics 110, the dummy gates 112, and the mask 114 for the dummy gate structures 108 may be formed by sequentially forming respective layers, and then patterning those layers into the dummy gate structures 108. For example, a layer for the interfacial dielectrics 110 may include or be silicon oxide, silicon nitride, the like, or multilayers thereof. A layer for the dummy gates 112 may include or be silicon (e.g., polysilicon) or another material. A layer for the masks 114 may include or be silicon nitride, silicon oxynitride, silicon carbon nitride, the like, or a combination thereof. The layers can be formed or deposited by any suitable deposition technique. The layers for the interfacial dielectrics 110, the dummy gates 112, and the mask 114 may then be patterned, for example, using photolithography and one or more etch processes, to form the interfacial dielectrics 110, the dummy gates 112, and the mask 114 for each dummy gate structure 108.

FIGS. 2, 3A, 4A, 5A, 6A, 7A, 8A, 9A, 10A, 11A, 12A, 13A, 14A and 15A are schematic cross-sectional views of respective intermediate structures of various stages of fabricating an integrated circuit (IC) structure corresponding to cross-section A-A in FIG. 1. Cross-section A-A in FIG. 1 is in a plane along, e.g., channels in the fin 102 between opposing source/drain regions 116. FIGS. 3B, 4B, 5B, 6B, 7B, 8B, 9B, 10B, 11B, 12B, 13B, 14B and 15B are schematic cross-sectional views of respective intermediate structures corresponding to various stages of fabrication and corresponding to cross-section B-B in FIG. 1. Cross-section B-B is in a plane perpendicular to cross-section A-A and is across the source/drain regions 116. FIGS. 5C, 6C, 7C, 8C, 9C, 10C, 11C, 12C, 13C, 14C and 15C are schematic top views of respective intermediate structures corresponding to various stages of fabrication and corresponding to FIG. 1.

FIG. 2 illustrates gate spacers 118 formed along sidewalls of the dummy gate structures 108 (e.g., sidewalls of the interfacial dielectrics 110, dummy gates 112, and masks 114) and over the fins 102. The gate spacers 118 may be formed by conformally depositing one or more layers for the gate spacers 118 and anisotropically etching the one or more layers, for example. The one or more layers for the gate spacers 118 may include a material different from the material(s) for the dummy gate structure 108. In some embodiments, the gate spacer 118 may include or be a dielectric material, such as silicon nitride, silicon oxynitride, silicon carbon nitride, the like, multi-layers thereof, or a combination thereof, and may be deposited by any suitable deposition technique.

After the gate spacers 118 are formed, exposed fins 102 are recessed to form recesses, for example, by dry etching process, wet etching process, and/or combination thereof, and then source/drain epitaxial structures 120 are formed in the recesses in the fins 102.

In various embodiments, the source/drain epitaxial structures 120 may include Ge, Si, GaAs, AlGaAs, SiGe, GaAsP, SiP, or other suitable material. In some embodiments, the source/drain epitaxial structures 120 may be in-situ doped during the epitaxial process. In some embodiments, the source/drain epitaxial structures 120 are not in-situ doped, and, for example, instead an implantation process is performed to dope the epitaxially grown the source/drain epitaxial structures 120. Although the source/drain epitaxial structures 120 illustrated in FIGS. 3A and 3B are formed by etching recesses in the fins 102 and then epitaxially growing semiconductor materials in the recesses in the fins 102, the source/drain epitaxial structures 120 in some other embodiments can be formed without recessing the fins 102. In that case, the source/drain epitaxial structures 120 would be formed to wrap around at least three sides of the fins 102.

Referring to FIGS. 4A and 4B, a contact etch stop layer (CESL) 122 and a first interlayer dielectric (ILD) layer 124 are sequentially formed on surfaces of the source/drain epitaxial structures 120, outer sidewalls and top surfaces of the gate spacers 118, top surfaces of the masks 114, and top surfaces of the isolation regions 106 using any suitable deposition technique. The CESL 122 is deposited conformally and may include or be silicon nitride, silicon carbon nitride, carbon nitride, the like, or a combination thereof. The first ILD layer 124 may include or be tetraethylorthosilicate (TEOS) oxide, silicon dioxide, a low-k dielectric material (e.g., a material having a dielectric constant lower than silicon dioxide), or the like. A chemical mechanical planarization (CMP) process may then be performed to planarize the first ILD layer 124 and the CESL 122 and to remove the masks 114 of the dummy gate structures 108, thereby leveling the top surface of the first ILD layer 124 and CESL 122 with the top surfaces of the dummy gates 112.

The dummy gate structures 108 are then removed using one or more etch processes. Upon removal of the dummy gate structures 108, recesses are formed between the gate spacers 118 where the dummy gate structures 108 are removed, and channel regions of the fins 102 are exposed through the recesses. Replacement gate structures 126 are then formed in the recesses where the dummy gate structures 108 were removed, as shown in FIGS. 4A and 4B. The replacement gate structure 126 may include an interfacial dielectric 128, a gate dielectric layer 130, one or more optional conformal layers 132, and a gate fill conductive material 134. The interfacial dielectric 128 is formed on top surfaces of the fins 102 along the channel regions. The interfacial dielectric 128 can be an oxide (e.g., silicon oxide) formed by thermal or chemical oxidation of the fin 102, and/or an oxide (e.g., silicon oxide), nitride (e.g., silicon nitride), and/or another dielectric layer using any suitable deposition technique.

The gate dielectric layer 130 can be conformally deposited in the recesses where the dummy gate structures 108 were removed (e.g., on the interfacial dielectric 128, and sidewalls of the gate spacers 118) and on the top surfaces of the first ILD layer 124, the CESL 122, and the gate spacers 118. The gate dielectric layer 130 can be or include silicon oxide, silicon nitride, a high-k dielectric material, multilayers thereof, or other dielectric material. A high-k dielectric material may have a k value greater than about 7.0, and may include a metal oxide of or a metal silicate of hafnium (Hf), aluminum (Al), zirconium (Zr), lanthanum (La), magnesium (Mg), barium (Ba), titanium (Ti), lead (Pb), multilayers thereof, or a combination thereof.

The one or more optional conformal layers 132 can include one or more barrier and/or capping layers and one or more work-function tuning layers. The one or more barrier and/or capping layers can include tantalum nitride, titanium nitride, the like, or a combination thereof. The one or more work-function tuning layer may include or be aluminum titanium carbide, aluminum titanium oxide, aluminum titanium nitride, the like, or a combination thereof. The materials for the one or more work-function tuning layer, the barrier layer and/or capping layer are selected so that a desired threshold voltage (Vt) is achieved for the transistor, which could be a p-type field effect transistor (pFET) or an n-type field effect transistor (nFET). A gate fill conductive material 134 is formed over the one or more conformal layers 132, if implemented, and/or the gate dielectric layer 130. The gate fill conductive material 134 can fill remaining recesses where the dummy gate structures 108 were removed. The gate fill conductive material 134 may be or include a metal-containing material such as tungsten, cobalt, aluminum, ruthenium, copper, multi-layers thereof, a combination thereof, or the like.

A planarization process, like a CMP, may remove portions of the gate fill conductive material 134, the one or more conformal layers 132, and the gate dielectric layer 130 above the top surfaces of the first ILD layer 124, the CESL 122, and the gate spacers 118. The replacement gate structures 126, each including the gate fill conductive material 134, the one or more conformal layers 132, the gate dielectric layer 130, and the interfacial dielectric 128, may therefore be formed as illustrated in FIGS. 4A and 4B. For simplicity, the interfacial dielectric 128, the gate dielectric layer 130, the one or more optional conformal layers 132, and the gate fill conductive material 134 are not shown in subsequent drawings.

In FIGS. 5A-5C, the replacement gate structures 126 are recessed in an etching step(s), so that recesses 136 are formed. The recesses 136 allow for subsequently formed gate cap material to be formed within the recesses 136 to protect the replacement gate structures 126. The recesses 136 are defined by the exposed inner surfaces 118S of the gate spacers 118 and the recessed top surfaces 126S of the replacement gate structures 126, respectively.

Figure 6B:
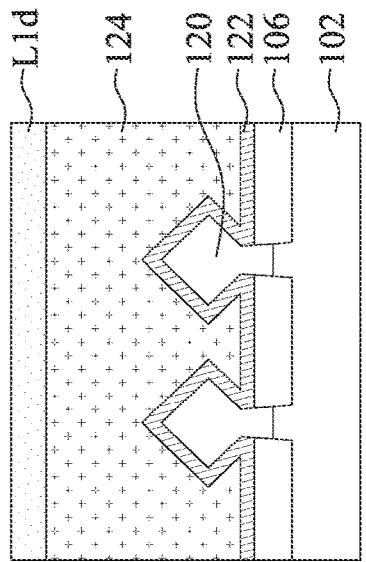
Figure 6C:
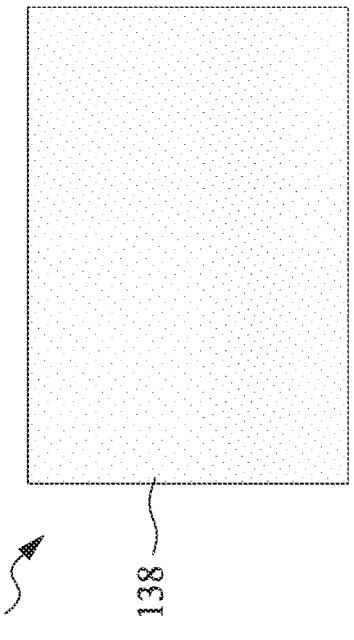

In FIGS. 6A-6C, a gate cap material 138 is formed over the first ILD layer 124 and within the recesses 136 over the replacement gate structures 126. In some embodiments, the gate cap material 138 is a dielectric material (e.g., phosphosilicate glass (PSG), $SiO_2$. SiN, SiOC, SiBN, SiOCN, BN) formed using a low sticking coefficient intermedium (e.g., a silicon-containing precursor or the like) which is less than about 0.5, thereby allowing the precursors to penetrate deep into the recesses 136. Sticking coefficient is a term used to describe the ratio of the number of adsorbate species (e.g., atoms or molecules) that adsorb/stick to a surface compared to the total number of species that impinge upon that surface during the same period of time. The gate cap material 138 is formed by a non-conformal deposition process (e.g., bottom-up deposition or flowable deposition a cyclic deposition-etch back process or a cyclic deposition-sputter back process). For example, in some embodiment where the gate cap material 138 is deposited through non-conformal chemical vapor deposition (CVD) methods, the deposition may include flowing a low sticking coefficient reactant into the reaction chamber with one or more co-reactants, while exposing the semiconductor substrate 100 to plasma. In some embodiments where the gate cap material 138 is SiN phosphosilicate glass (PSG), the gate cap material 138 may be formed using precursors including $SiH_4$, $NH_3$, or the like, and oxygen and $PH_3$ at a temperature in a range from about 250° C. to about 500° C. (e.g., 350° C.). The gate cap material 138 can form from a cyclic deposition-etch back process or a cyclic deposition-sputter back process The sticking coefficient of $SiH_4$ and its fragment in plasma, oxygen and $PH_3$ at the relevant deposition condition may be about less than 0.1 and easier to form bottom up at inductively coupled plasma (ICP) chemical vapor deposition (CVD) tool or a high density plasma CVD (HDP-CVD) tool. The bottom up Si gate cap material 138 deliver a good gets protection during source/drain contact opening and after source/drain contact opening the bottom up Si gate cap material 138 been replaced to a oxide or SiN or low-k material or the like. In some embodiments where the gate cap material 138 is $SiO_2$, the gate cap material 138 may be formed using precursors including $SiH_4$ and oxygen at a temperature in a range from about 350° C. to about 450° C. (e.g., 400° C.). The sticking coefficient of $SiH_4$ and oxygen at the relevant deposition condition may be about 0.2 to about 0.3 (e.g., 0.26). In some other embodiments where the gate cap material 138 is $SiO_2$, the gate cap material 138 may be formed using precursors including tetraethyl orthosilicate (TEOS) and oxygen at a temperature in a range from about 650° C. to about 750° C. (e.g., 700° C.). The sticking coefficient of TEOS and oxygen at the relevant deposition condition may be about 0.03 to 0.05 (e.g., 0.04). However, it should be appreciated that the precursors and the process temperatures of forming the gate cap material 138 should not be limited to abovementioned embodiments.

In some embodiments, the gate cap material 138 is formed by a bottom-up deposition process using an inductively coupled plasma (ICP) chemical vapor deposition (CVD) tool or a high density plasma CVD (HDP-CVD) tool. In some other embodiments, the gate cap material 138 is formed by a flowable chemical vapor deposition (FCVD) process using a plasma enhanced CVD (PECVD) tool. In some other embodiments, the gate cap material 138 is formed by a cyclic deposition-etch back process. In some other embodiments, the gate cap material 138 is formed by a cyclic deposition-sputter back process. The bottom-up deposition or flowable or cyclic deposition-etch back process or cyclic deposition-sputter back process deposition can prevent unwanted seams and/or voids resulting from conformal deposition. If the gate cap material 138 is formed using conformal deposition, these seams and/or voids may become weak points within the gate cap material 138 that may cause the replacement gate structures 126 to be unintentionally exposed during a subsequent etching process (e.g., chemical mechanical polishing) or wet clean process. Therefore, the bottom-up deposition or flowable or cyclic deposition-etch back process or cyclic deposition-sputter back process deposition can achieve an improved yield because of reduced voids and/or seams.

For example, the HDP-CVD process exhibits a non-conformal deposition behavior (e.g., bottom-up deposition) by directing precursor species downward, to the bottom of the recess 136, while simultaneously trimming deposited material from sidewalls of the recess 136 through sputtering by the use of biased RF power applied to the semiconductor substrate 100. The sputtering acts to remove material from sidewalls of the recess 136, and thus results in a slower deposition rate in a lateral direction (i.e., horizontal direction) than in a vertical direction, so that the HDP-CVD process exhibits a bottom-up deposition behavior and promotes gap-filling during deposition. Even more to boost bottom-up performance in HDP-CVD process, cyclic sputter-deposition or cyclic etch-deposition or pulsed RF (source RF or/and bias RF pulsed; source/bias RF pulsing are synchronized or none-synchronized) are used. The flowable CVD process exhibits a non-conformal deposition behavior by reacting the precursors of gate cap material 138 to form a condensed flowable film on the semiconductor substrate 100. This flowable film flows into the recess 136 to fill the recess 136 with the gate cap material 138. The flowable film is then converted to a solid material by one or more of various techniques including a thermal anneal, ultraviolet (UV) exposure, microwave exposure, or exposure to an oxidizing plasma. According to certain embodiments, the flowable film is converted to the solid material by mechanisms including (but not limited to) cross-linking the precursor to produce the solid material and/or removal of hydrogen (—H), hydroxyl (—OH) or water (H$_2$O) groups.

In some embodiments, the gate cap material 138 is deposited at a low pressure lower than 760 torr, lower than 10 torr, lower than 0.1 torr, lower than 0.01 torr, or lower than 0.001 torr. Such low pressure level can increase mean free path of ions and dissociated species in the deposition process, thus improving gap-fill of the gate cap material 138. In greater detail, increasing in mean free path of ions and dissociated species can result in higher probability that dissociated species can travel to the bottom of the recess 136 to assist the bottom-up deposition process. In some embodiments, the mean free path satisfies:

$$\lambda_m = \frac{1}{260P},$$

where $\lambda_m$ is the mean free path of ions and dissociated species, and P is the pressure in deposition chamber. Because the mean free path is in negative correlation with the deposition pressure, the selected low pressure of depositing the gate cap material 138 can increase the mean free path of dissociated precursors of the gate cap material 138, thus improving the bottom-up deposition. For example, when the pressure is less than 760 torr, the mean free path is greater than 6.26×10$^{-6}$ cm. When the pressure is less than 1 torr, the mean free path is greater than 4.5×10$^{-3}$ cm. When the pressure is less than 0.1 torr, the mean free path is greater than 4.5×10$^{-2}$ cm. When the pressure is less than 0.01 torr, the mean free path is greater than 0.45 cm. When the pressure is less than 0.001 torr, the mean free path is greater than 4.5 cm.

In some embodiments, deposition of the gate cap material 138 results in a multi-layer stack of the gate cap material 138, which includes, for example, a first layer L1a, a second layer L1b over the first layer L1a, a third layer L1c over the second layer L1b, and a fourth layer L1d over the third layer L1c. The non-conformal deposition process results in that the gate cap material 138 has non-uniformity in density. Each of the layers of the gate cap material 138 has an upper portion densified due to the sputtering step in the HDP-CVD process. In other words, the non-conformal deposition process results in that the gate cap material 138 has an inner interface within the gate cap material 138. Observable interfaces between adjacent two of the first layer L1a, the second layer L1b, the third layer L1c and the fourth layer L1d are marked by lines L1 (see FIG. 7A). These interfaces resemble a U-shaped like or V-shaped like profile. The inner interface is form by cyclic sputter-deposition or cyclic etch-deposition or pulsed RF and the inner interface number is dependent on cyclic number. Interfaces between adjacent two of the first layer L1a, the second layer L1b, the third layer L1c and the fourth layer L1d can be observed using, for example, transmission electron microscopy (TEM), even if these layers are formed of a same single continuous material in a sing continuous deposition step. In some other embodiments where the gate cap material 138 is formed using FCVD, the interfaces between the layers (e.g., the first layer L1a, the second layer L1b, the third layer L1c and the fourth layer L1d) of the gate cap material 138 may not be observed.

In some embodiments, each of the first layer L1a, the second layer L1b, and the third layer L1c, has opposite top ends which terminate at the inner sidewalls of the gate spacer 118, respectively. Side portions of the first layer L1a have a thickness increasing in a direction toward the replacement gate structure 126. For example, the side portions of the first layer L1a form slanted interfaces with the second layer L1b. Moreover, the maximal thickness of the side portions of the first layer L1a is greater than a thickness t3 of the bottom portion of the first layer L1a.

In some embodiments, the second layer L1b has a bottom portion B1 and side portions S1 extending upward from the bottom portion B1, and the bottom portion B1 has a thickness t1 different from a thickness t2 of the side portion S1. For example, the bottom portion B1 has the thickness t1 greater than the thickness t2 of the side portion S1. The thickness t1 of the bottom portion B1 of the second layer L1b is different from a thickness t3 of a bottom portion of the first layer L1a which is directly under the bottom portion B1. For example, the thickness t1 is greater than the thickness t3. It will be noted that, the thickness t3 of the bottom portion of the first layer L1a and the thickness t1 of the bottom portion of the second layer L1b are not limited to the above configuration. For example, the thickness t3 and the thickness t1 can be the same in some other embodiments.

The fourth layer L1d has a fill portion EP filling up the remainder of the recess 136 and a covering portion CP over the fill portion EP and outside the recess 136. The fill portion EP is located in the recess 136. The covering portion CP extends along the top of the first ILD layer 124.

The gate cap material 138 includes, but is not limited to, four layers in the embodiment. The gate cap material 138 may include other numbers of the layers in some other embodiments.

Reference is made to FIGS. 7A-7C. A CMP process is performed to remove excess gate cap material 138 outside the recess 136 to expose the first ILD layer 124. In some embodiments, the gate cap material 138 has higher etch selectivity than the first ILD layer 124, so that the gate cap material 138 can protect the gate structure 126 from the subsequent etching process of forming source/drain contact openings, which allows for the source/drain contacts formed over the source/drain epitaxial structures 120 in a self-aligned manner. In that case, the gate cap material 138 can also called self-aligned contact (SAC) cap. The remaining portion of the gate cap material 138 in the recess 136 is called gate SAC cap 138a.

Reference is made to FIGS. 8A-8C. A hard mask structure 140 and a first hard mask layer 148 are formed on the first ILD layer 124 and the gate SAC cap 138a in sequence. In some embodiments, the hard mask structure 140 includes a first dielectric layer 142, a second dielectric layer 144, and a third dielectric layer 146 stacked in sequence. In some embodiments, the first dielectric layer 142 is a silicon oxide layer, the second dielectric layer 144 is a tungsten doped carbide layer, TIN, TaN, or metal oxide, and the third dielectric layer 146 is a silicon oxide layer. In some embodiments, the first hard mask layer 148 is a silicon layer.

Figure 9A:
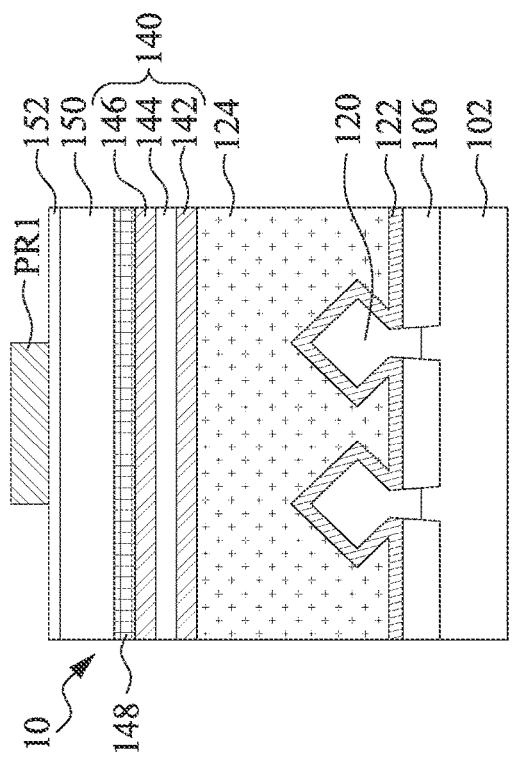
Figure 9B:
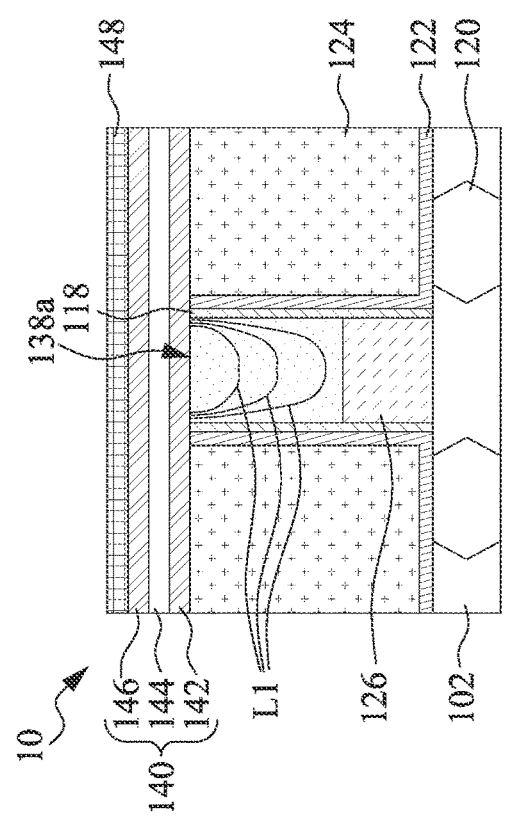
Figure 9C:
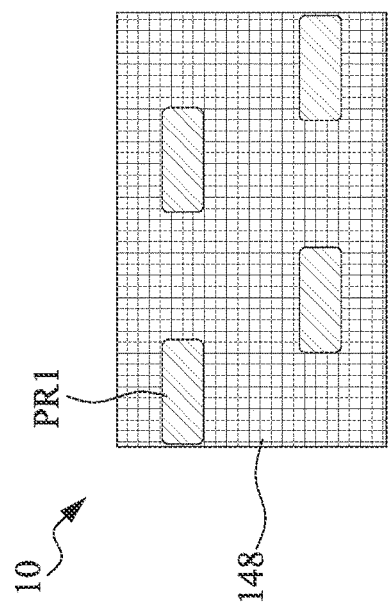

Reference is made to FIGS. 9A-9C. A second hard mask layer (e.g., a spin-on carbon (SOC) layer) 150, a bottom anti-reflectance coating (BARC) layer 152, and a patterned photoresist PR1 are formed on the hard mask structure 140 in sequence. For example, the BARC layer 152 includes silicon oxynitride (e.g., SiON) and is formed to reduce undesired light reflections from an underlying layer (e.g., the second hard mask layer 150) surface during a photolithographic patterning process. The patterned photoresist PR may be formed by spin-on coating and then patterned to form an opening. In some embodiments, the second hard mask layer 150, the BARC layer 152 and the photoresist layer PR1 are collectively referred to as a tri-layer mask, wherein the second hard mask layer 150 is also called a bottom layer (BL) of the tri-layer mask, the BARC layer 152 is also called a middle layer (ML) of the tri-layer mask, and the photoresist layer PR is also called a top layer of the tri-layer mask.

The exposed portion of the BARC layer 152 and the underlying second hard mask layer 150 are removed by an etching process, resulting a patterned hard mask (not shown). After etching, the patterned photoresist PR1 is removed. Subsequently, the first hard mask layer 148 is etched through the opening of the patterned hard mask (not shown). The second hard mask layer 150 and the BARC layer 152 are then removed, and the resulting structure is shown in FIGS. 10A-10C.

Reference is made to FIGS. 11A-11C. A third hard mask layer (e.g., a spin-on carbon (SOC) layer) 154, a bottom anti-reflectance coating (BARC) layer 156, and a patterned photoresist PR2 are formed on the hard mask structure 140 in sequence. For example, the BARC layer 156 includes silicon oxynitride (e.g., SiON) and is formed to reduce undesired light reflections from an underlying layer (e.g., the third hard mask layer 154) surface during a photolithographic patterning process. The patterned photoresist PR2 may be formed by spin-on coating and then patterned to form an opening.

The exposed portion of the BARC layer 156 and the underlying third hard mask layer 154 are removed by an etching process, resulting a patterned hard mask (not shown). After etching, the patterned photoresist PR2 is removed. Subsequently, the second dielectric layer 144 and the third dielectric layer 146 are etched through the opening of the patterned hard mask (not shown) and the opening of the first hard mask layer 148. The third hard mask layer 154, the BARC layer 156 and the first hard mask layer 148 are then removed, and the resulting structure is shown in FIGS. 12A-12C.

Source/drain contact openings 158 are formed through the first ILD layer 124 to expose at least portions of the source/drain epitaxial structures 120, as an example shown in FIGS. 13A-13C. In some embodiments, the source/drain contact openings 158 may extend into the source/drain epitaxial structures 120 to facilitate forming metal source/drain contacts that extend into/below the top surface of the source/drain epitaxial structures 120. The first ILD layer 124 may be patterned with the openings of the second dielectric layer 144 and the third dielectric layer 146, for example, using photolithography and one or more etch processes. The source/drain contact openings 158 allow for forming source/drain contact for making electrical contact to the source/drain epitaxial structures 120 for the transistors.

Figure 14A:
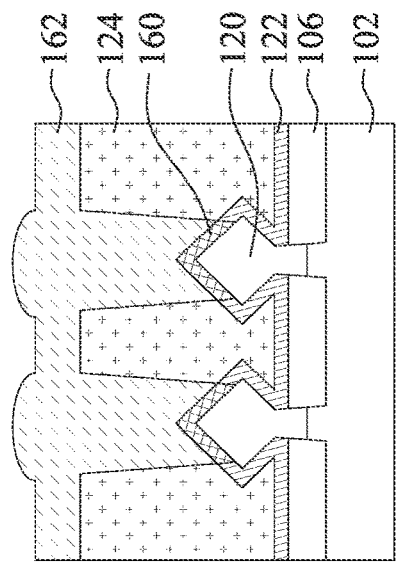
Figure 14B:
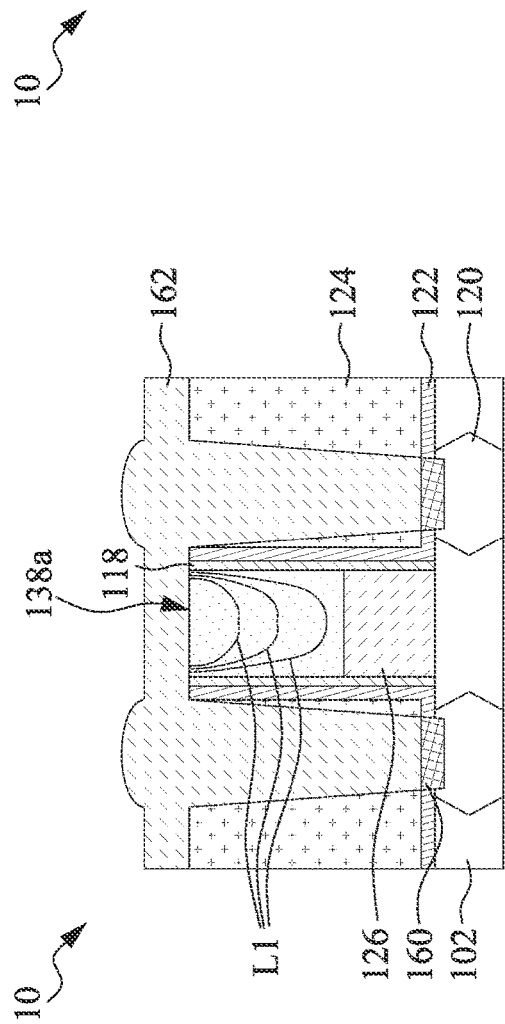
Figure 14C:
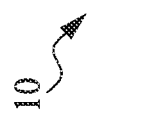
Figure 16A:
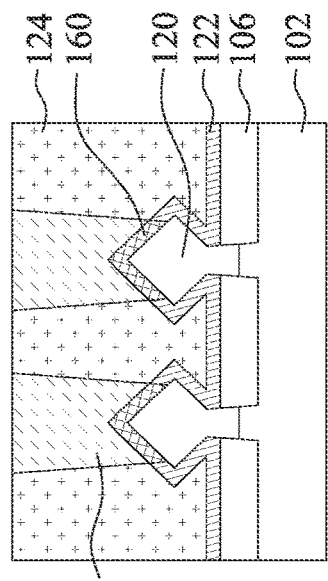
Figure 16B:
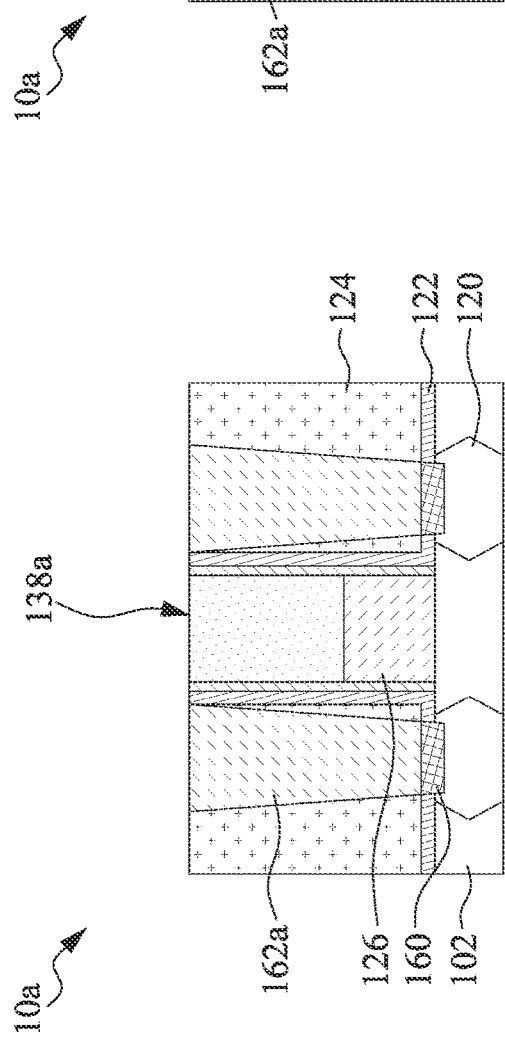
Figure 16C:
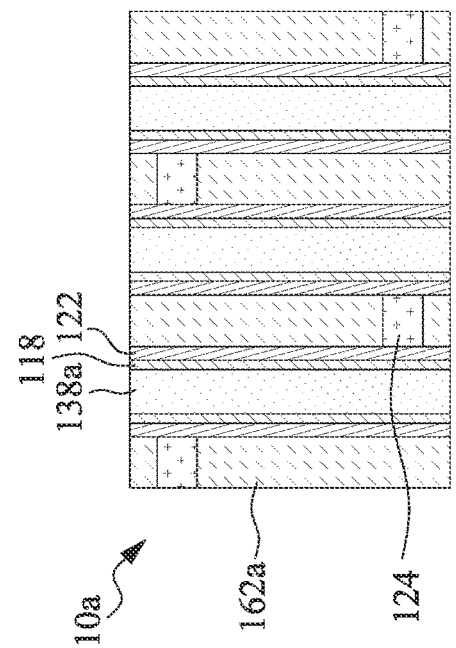
Figure 17A:
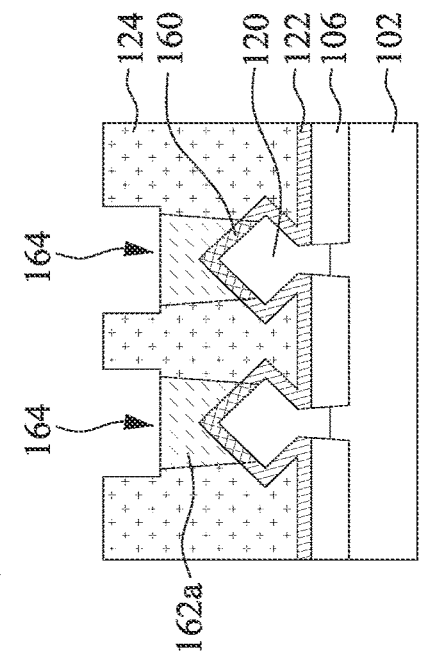
Figure 17B:
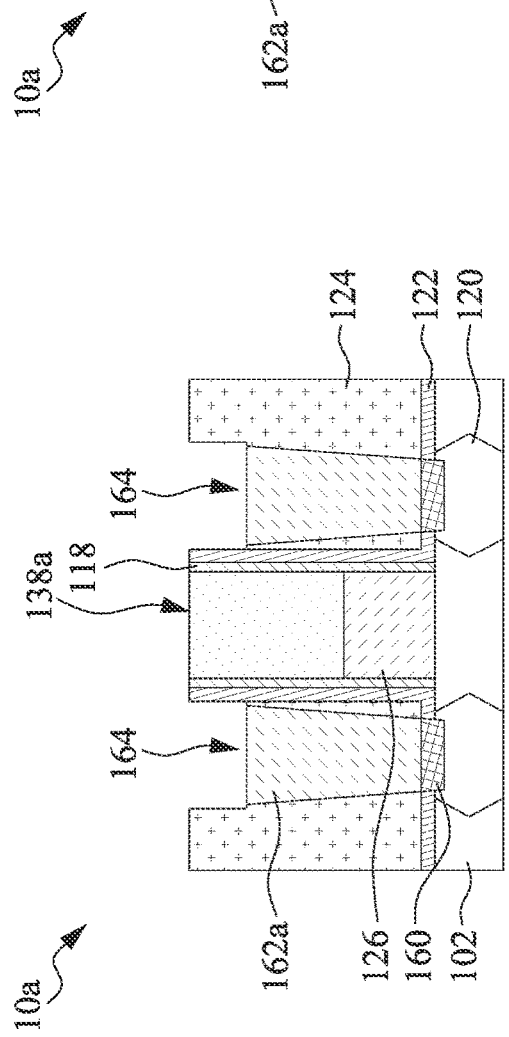
Figure 17C:
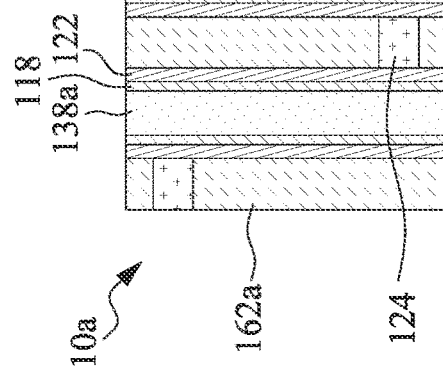

Reference is made to FIGS. 14A-14C. Silicide regions 160 are formed by a process that includes depositing a metal layer, such as titanium, cobalt, nickel, tungsten, or the like, over the device, including the exposed surfaces of the source/drain epitaxial structures 120 and then annealing the metal layer such that the metal layer is able to react with the source/drain epitaxial structures 120 to form silicide regions 160, and removing the non-reacted metal layer. Afterwards, a conductive material 162 is deposited, in which a single layer or a multilayer (including a plurality of conductive layers) is formed. Next, a planarization step such as CMP is performed to remove excess material of the conductive material 162, to planarize the top surface of the device. The remaining portion of the conductive material 162 refers to source/drain contacts 162a. A resulting structure is shown in FIGS. 15A-15C. It is understood that the IC structure 10 shown in FIGS. 15A-15C undergoes further complementary metal-oxide semiconductor (CMOS) processes to form various features such as interconnect metal layers, dielectric layers, passivation layers, etc.

FIGS. 16A-19C show cross-sectional views of intermediate stages in fabricating an IC structure 10a according to some embodiments of the present disclosure. Many respects of the IC structure 10a are similar to those of the IC structure 10. One difference between the two IC structures lies in the source/drain contact 162a of the IC structure 10a are recessed in an etching step, so that recesses 164 are formed, as shown in FIGS. 17A-17C. The recesses 164 allow for contact caps to be formed within the recesses 164 to protect the source/drain contacts 162a in subsequent processing. The recesses 164 are defined by the exposed inner surfaces of the first ILD layer 124 and the recessed top surfaces of the source/drain contacts 162a, respectively.

In FIGS. 18A-18C, a contact cap material 166 is formed over the first ILD layer 124 and within the recesses 164 over the source/drain contacts 162a followed by a CMP process to remove excess contact cap material 166 outside the recesses 164 to expose the first ILD layer 124 and the gate SAC cap 138a. In some embodiments, the contact cap material 166 is a dielectric material (e.g., phosphosilicate glass (PSG), $SiO_2$, SiN, SiOC, SiBN, SiOCN, BN) formed using a low sticking coefficient intermedium (e.g., a silicon-containing precursor or the like) which is less than about 0.5, thereby allowing the precursors to penetrate deep into the recesses 164. The contact cap material 166 is formed by a non-conformal deposition process (e.g., bottom-up deposition or flowable deposition or cyclic deposition-etch back process or cyclic deposition-sputter back process or a pulsed RF deposition process). For example, in some embodiment where the contact cap material 166 is deposited through non-conformal chemical vapor deposition (CVD) methods, the deposition may include flowing a low sticking coefficient reactant into the reaction chamber with one or more co-reactants, while exposing the semiconductor substrate 100 to plasma. In some embodiments where the contact cap material 166 is SiOC, the contact cap material 166 may be formed using precursors including SiH₄, oxygen and PH₃ at a temperature in a range from about 350° C. to about 450° C. (e.g., 400° C.). The sticking coefficient of SiH₄, oxygen and PH₃ at the relevant deposition conditions may be about 0.3 to 0.4 (e.g., 0.35). In some embodiments where the contact cap material 166 is SiO₂, the contact cap material 166 may be formed using precursors including SiH₄ and oxygen at a temperature in a range from about 350° C. to about 450° C. (e.g., 400° C.). The sticking coefficient of SiH₄ and oxygen at the relevant deposition conditions may be about 0.2 to about 0.3 (e.g., 0.26). In some other embodiments where the contact cap material 166 is SiO₂, the contact cap material 166 may be formed using precursors including tetraethyl orthosilicate (TEOS) and oxygen at a temperature in a range from about 650° C. to about 750° C. (e.g., 700° C.). The sticking coefficient of TEOS and oxygen at the relevant deposition conditions may be about 0.03 to about 0.05 (e.g., 0.04). However, it should be appreciated that the precursors and the process temperatures of forming the contact cap material 166 should not be limited to abovementioned embodiments.

In some embodiments, the contact cap material 166 is formed by a bottom-up deposition process using an inductively coupled plasma (ICP) chemical vapor deposition (CVD) tool or a high density plasma CVD (HDP-CVD) tool. In some other embodiments, the gate cap material 138 is formed by a flowable CVD (FCVD) process using a plasma enhanced CVD (PECVD) tool. The bottom-up deposition or flowable deposition can prevent unwanted seams and/or voids resulting from conformal deposition. If the contact cap material 166 is formed using conformal deposition, these seams and/or voids may become weak points within the contact cap material 166 that may cause the source/drain contacts 162a to be unintentionally exposed during a subsequent etching process (e.g., chemical mechanical polishing) or wet clean process. Therefore, the bottom-up deposition or flowable deposition or cyclic deposition-etch back process or cyclic deposition-sputter back process or a pulsed RF deposition process can achieve an improved yield because of reduced voids and/or seams.

For example, the HDP-CVD process exhibits a non-conformal deposition behavior (e.g., bottom-up deposition) by directing precursor species downward, to the bottom of the recess 164, while simultaneously trimming deposited material from sidewalls of the recess 164 through sputtering by the use of biased RF power applied to the semiconductor substrate 100. The sputtering acts to remove material from sidewalls of the recess 136, and thus results in a slower deposition rate in a lateral direction (i.e., horizontal direction) than in a vertical direction, so that the HDP-CVD process exhibits a bottom-up deposition behavior and promotes gap-filling during deposition. The flowable CVD process exhibits a non-conformal deposition behavior by reacting the precursors of the gate cap material 138 to form a condensed flowable film on the semiconductor substrate 100. This flowable film flows into the recess to fill the recess 164 with the contact cap material 166. The flowable film is then converted to a solid material by one or more of various techniques including a thermal anneal, ultraviolet (UV) exposure, microwave exposure, or exposure to an oxidizing plasma. According to certain embodiments, the flowable film is converted to the solid material by mechanisms including (but not limited to) cross-linking the precursor to produce the solid material and/or removal of hydrogen (—H), hydroxyl (—OH) or water (H₂O) groups.

In some embodiments, the contact cap material 166 is deposited at a low pressure lower than 760 torr, lower than 1 torr, lower than 0.1 torr, lower than 0.01 torr, or lower than 0.001 torr. Such low pressure level can increase mean free path of ions and dissociated species in the deposition process, thus improving gap-fill of the contact cap material 166. In greater detail, increasing in mean free path of ions and dissociated species can result in higher probability that dissociated species can travel to the bottom of the recess 164 to assist the bottom-up deposition process. In some embodiments, the mean free path satisfies:

$$\lambda_m = \frac{1}{260P},$$

where $\lambda_m$ is the mean free path of ions and dissociated species, and P is the pressure in deposition chamber. Because the mean free path is in negative correlation with the deposition pressure, the selected low pressure of depositing the contact cap material 166 can increase the mean free path of dissociated precursors of the contact cap material 166, thus improving the bottom-up deposition.

In some embodiments, deposition of the contact cap material 166 results in a multi-layer stack of the gate cap material 138, which includes, for example, a first layer L2a, a second layer L2b over the first layer L2a, a third layer L2c over the second layer L2b, and a fourth layer L2d over the third layer L2c The non-conformal deposition process results in that the contact cap material 166 has non-uniformity in density. Each of the layers of the contact cap material 166 has an upper portion densified due to the sputtering step in the HDP-CVD process. In other words, the non-conformal deposition process results in that the contact cap material 166 has an inner interface within the contact cap material 166. Observable interfaces between adjacent two of the first layer L2a, the second layer L2b, the third layer L2c and the fourth layer L2d are marked by lines L2 (see FIG. 18B). These interfaces resemble a U-shaped or V-shaped like profile. Because of the density non-uniformity, interfaces between adjacent two of the first layer L2a, the second layer L2b, the third layer L2c and the fourth layer L2d can be observed using, for example, transmission electron microscopy (TEM), even if these layers are formed of a same single continuous material in a sing continuous deposition step. In some other embodiments where the contact cap material 166 is formed using FCVD or PECVD, the interfaces between the layers (e.g., the first layer L2a, the second layer L2b, the third layer L2c and the fourth layer L2d) of the contact cap material 166 may not be observed.

Interfaces between each of the first layer L2a, the second layer L2b, the third layer L2c and the fourth layer L2d are marked by dotted lines L2 (see FIG. 18B). These interfaces resemble a U-shaped like profile. A CMP process is performed to remove excess contact cap material 166 outside the recesses 164 to expose the first ILD layer 124 and the gate SAC cap 138a. The contact cap material 166 has different etch selectivity than the gate SAC cap 138a, the gate spacers 118 and the first ILD layer 124 so as to selective etch back the contact cap material 166. The remaining portion of contact cap material 166 can be referred to as a contact self-align contact (SAC) cap 166.

Figure 19A:
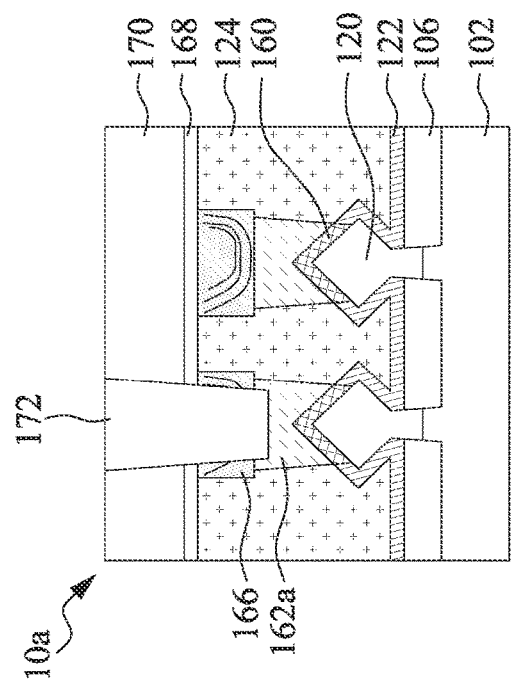
Figure 19B:
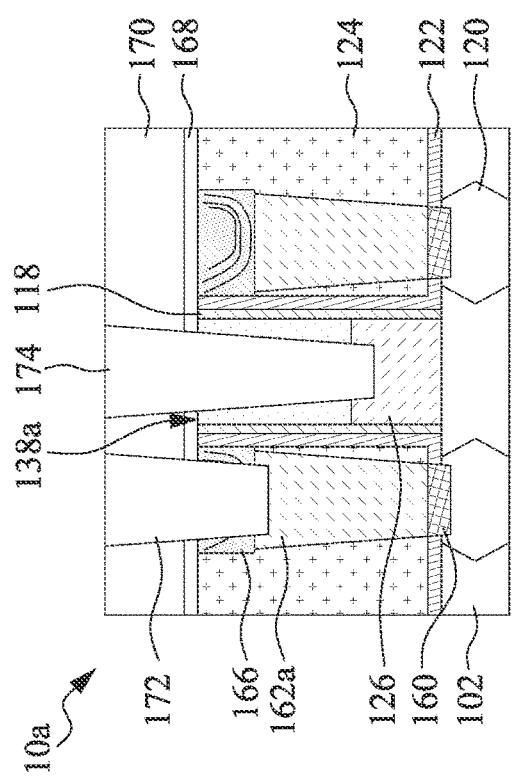
Figure 19C:
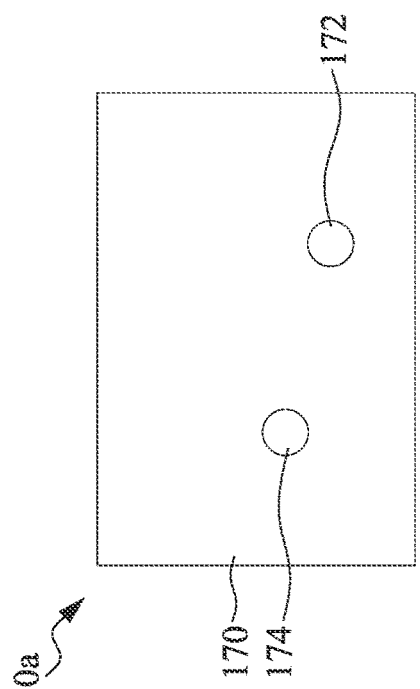

Reference is made to FIGS. 19A-19C. An etch stop layer (ESL) 168 and a second ILD layer 170 are subsequently formed over the structure of FIGS. 18A-18C. Then, a patterning operation is performed to form via holes through the second ILD layer 170, the etch stop layer 168 and the contact SAC cap 166. The via holes are filed with one or more conductive materials so as to form via plugs 172, 174 over the source/drain contact 162a and the replacement gate structure 126, respectively, as shown in FIGS. 19A-19C. The via plugs 172, 174 may provide interconnection to one or more of the interconnect layers of a multilayer interconnect (MLI). The via plugs 172, 174 may include tungsten or other suitable conductive element. The via plug 172 can be referred to as source/drain via because it is formed over the source/drain contact 162a, and the via plug 174 can be referred to as a gate via because it is formed over the gate structure 126.

It is understood that the IC structure 10a shown in FIGS. 19A-19C undergoes further CMOS processes to form various features such as interconnect metal layers, dielectric layers, passivation layers, etc.

FIGS. 20A-32C show cross-sectional views of intermediate stages in fabricating an IC structure 10b according to some embodiments of the present disclosure. The IC structure 10b at this fabrication stage of FIGS. 20A-20C can be prepared by the operation as illustrated in FIGS. 1-5C. As shown in FIGS. 20A-20C, a dummy gate cap material 238 is formed over the first ILD layer 124 and within the recess 136. Many respects of the IC structure 10b are similar to those of the IC structure 10. One difference between the dummy gate cap material 238 in FIGS. 20A-20C and the gate cap material 138 in FIGS. 6A-6C lies in the material of the dummy gate cap material 238.

In some embodiments, the dummy gate cap material 238 is a high etch resistant material (e.g., Si, W, WC, metal oxide) formed using a low sticking coefficient intermedium (e.g., a silicon-containing precursor, a tungsten-containing precursor or the like) which is less than about 0.5, thereby allowing the precursors to penetrate deep into the recesses 136. In some embodiments where the dummy gate cap material 238 is Si, the dummy gate cap material 238 may be formed using precursor including $SiH_4$ and He or Ar at a temperature in a range from about 250° C. to about 500° C. The sticking coefficient of $SiH_4$ and its fragment in plasma at the relevant deposition conditions may be less than about 0.01. In some embodiments where the dummy gate cap material 238 is tungsten, the dummy gate cap material 238 may be formed using precursor including $WF_6$ and $H_2$ at a temperature in a range from about 350° C. to about 500° C. The sticking coefficient of $WF_6$ and $H_2$ at the relevant deposition conditions may be less than about 0.01.

As mentioned above, the dummy gate cap material 238 is formed by a non-conformal deposition process (e.g., bottom-up deposition or flowable deposition or cyclic deposition-etch back process or cyclic deposition-sputter back process or a pulsed RF deposition process). In some embodiments, the dummy gate cap material 238 is formed by a bottom-up deposition process using an inductively coupled plasma (ICP) chemical vapor deposition (CVD) tool or a high density plasma CVD (HDP-CVD) tool In some other embodiments, the gate cap material 138 is formed by a flowable CVD (FCVD) process using a plasma enhanced CVD (PECVD) tool. The bottom-up deposition or flowable deposition can prevent unwanted seams and/or voids resulting from conformal deposition. If the dummy gate cap material 238 is formed using conformal deposition, these seams and/or voids may become weak points within the dummy gate cap material 238 that may cause the replacement gate structures 126 to be unintentionally exposed during a subsequent etching process (e.g., chemical mechanical polishing) or wet clean process. Therefore, the bottom-up deposition or flowable or cyclic deposition-etch back process or cyclic deposition-sputter back process or a pulsed RF deposition process deposition can achieve an improved yield because of reduced voids and/or seams. Other details of e HDP-CVD process and the flowable CVD process to form the dummy gate cap material 238 is similar to forming the gate cap material 138, as described previously with respect to FIGS. 6A-6C.

In some embodiments, the dummy gate cap material 238 is deposited at a low pressure lower than 760 torr, lower than 1 torr, lower than 0.1 torr, lower than 0.01 torr, or lower than 0.001 torr. Such low pressure level can increase mean free path of ions and dissociated species in the deposition process, thus improving gap-fill of the dummy gate cap material 238. In greater detail, increasing in mean free path of ions and dissociated species can result in higher probability that dissociated species can travel to the bottom of the recess 136 to assist the bottom-up deposition process. In some embodiments, the mean free path satisfies:

$$\lambda_m = \frac{1}{260P},$$

$\lambda_m$ is the mean free path of ions and dissociated species, and P is the pressure in deposition chamber. Because the mean free path is in negative correlation with the deposition pressure, the selected low pressure of depositing the dummy gate cap material 238 can increase the mean free path of dissociated precursors of the dummy gate cap material 238, thus improving the bottom-up deposition.

In some embodiments, deposition of the dummy gate cap material 238 results in a multi-layer stack of the dummy gate cap material 238, which includes, for example, a first layer L3a, a second layer L3b over the first layer L3a, a third layer L3c over the second layer L3b, and a fourth layer L3d over the third layer L3c. The non-conformal deposition process results in that the dummy gate cap material 238 has non-uniformity in density. Each of the layers of the dummy gate cap material 238 has an upper portion densified due to the sputtering step in the HDP-CVD process. In other words, the non-conformal deposition process results in that the dummy gate cap material 238 has an inner interface within the gate cap material 138. Observable interfaces between adjacent two of the first layer L3a, the second layer L3b, the third layer L3c and the fourth layer L3d are marked by lines L3 (see FIG. 21A). These interfaces resemble a U-shaped like profile.

Reference is made to FIGS. 21A-21C. A CMP process is performed to remove excess dummy gate cap material 238 outside the recess 136 to expose the first ILD layer 124. In some embodiments, the dummy gate cap material 238 has different etch selectivity than and the first ILD layer 124, so that the dummy gate cap material 238 can protect the gate structure 126 from the subsequent etching process of forming source/drain contact openings, which allows for the source/drain contacts formed over the source/drain epitaxial structures 120 in a self-aligned manner. In that case, the dummy gate cap material 238 can be referred to as a dummy gate self-align contact (SAC) cap 238a.

Reference is made to FIGS. 22A-22C. A hard mask structure 140 and a first hard mask layer 148 are formed on the first ILD layer 124 and the dummy gate SAC cap 238a in sequence. In some embodiments, the hard mask structure 140 includes a first dielectric layer 142, a second dielectric layer 144, and a third dielectric layer 146 stacked in sequence. In some embodiments, the first dielectric layer 142 is a silicon oxide layer, the second dielectric layer 144 is a tungsten doped carbide layer, TaN, TiN or metal oxide, and the third dielectric layer 146 is a silicon oxide layer. In some embodiments, the first hard mask layer 148 is a silicon layer.

Reference is made to FIGS. 23A-23C. A second hard mask layer (e.g., a spin-on carbon (SOC) layer) 150, a bottom anti-reflectance coating (BARC) layer 152, and a patterned photoresist PR1 are formed on the hard mask structure 140 in sequence. For example, the BARC layer 152 includes silicon oxynitride (e.g., SiON) and is formed to reduce undesired light reflections from an underlying layer (e.g., the second hard mask layer 150) surface during a photolithographic patterning process. The patterned photoresist PR may be formed by spin-on coating and then patterned to form an opening. In some embodiments, the second hard mask layer 150, the BARC layer 152 and the photoresist layer PR are collectively referred to as a tri-layer mask, wherein the second hard mask layer 150 is also called a bottom layer (BL) of the tri-layer mask, the BARC layer 152 is also called a middle layer (ML) of the tri-layer mask, and the photoresist layer PR is also called a top layer of the tri-layer mask.

The exposed portion of the BARC layer 152 and the underlying second hard mask layer 150 are removed by an etching process, resulting a patterned hard mask (not shown). After etching, the patterned photoresist PR1 is removed. Subsequently, the first hard mask layer 148 is etched through the opening of the patterned hard mask (not shown). The second hard mask layer 150 and the BARC layer 152 are then removed, and the resulting structure is shown in FIGS. 24A-24C.

Reference is made to FIGS. 25A-25C. A second third hard mask layer (e.g., a spin-on carbon (SOC) layer) 154, a bottom anti-reflectance coating (BARC) layer 156, and a patterned photoresist PR2 are formed on the hard mask structure 140 in sequence. For example, the BARC layer 156 includes silicon oxynitride (e.g., SiON) and is formed to reduce undesired light reflections from an underlying layer (e.g., the third hard mask layer 154) surface during a photolithographic patterning process. The patterned photoresist PR2 may be formed by spin-on coating and then patterned to form an opening.

The exposed portion of the BARC layer 156 and the underlying third hard mask layer 154 are removed by an etching process, resulting a patterned hard mask (not shown). After etching, the patterned photoresist PR2 is removed. Subsequently, the second dielectric layer 144 and the third dielectric layer 146 are etched through the opening of the patterned hard mask (not shown) and the opening of the first hard mask layer 148. The third hard mask layer 154, the BARC layer 156 and the first hard mask layer 148 are then removed, and the resulting structure is shown in FIGS. 26A-26C.

Source/drain contact openings 158 are formed through the first ILD layer 124 to expose at least portions of the source/drain epitaxial structures 120, as an example shown in FIGS. 27A-27C. In some embodiments, the source/drain contact openings 158 may extend into the source/drain epitaxial structures 120 to facilitate forming metal source/drain contacts that extend into/below the top surface of the source/drain epitaxial structures 120. The first ILD layer 124 may be patterned with the openings of the second dielectric layer 144 and the third dielectric layer 146, for example, using photolithography and one or more etch processes. The source/drain contact openings 158 allow for forming source/drain contact for making electrical contact to the source/drain epitaxial structures 120 for the transistors.

Figure 28A:
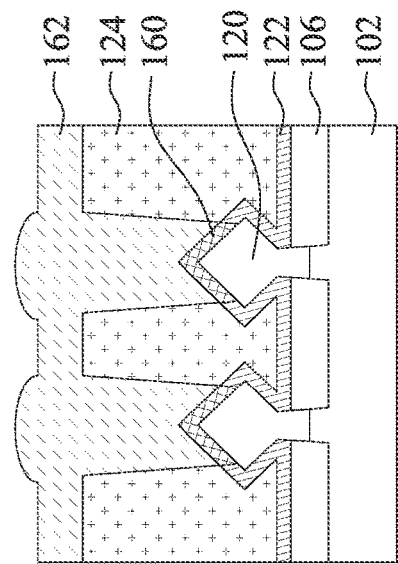
Figure 28B:
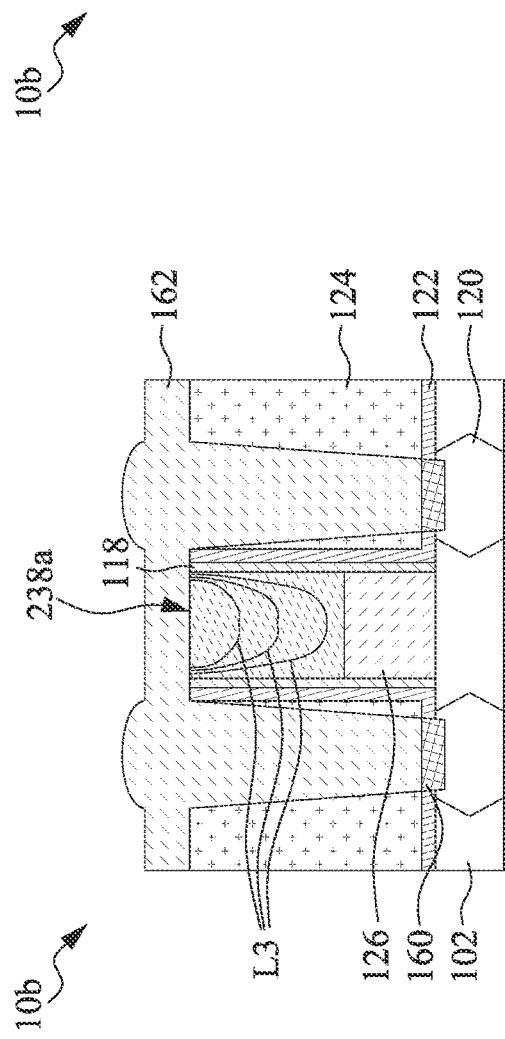
Figure 28C:

Reference is made to FIGS. 28A-28C. Silicide regions 160 are formed by a process that includes depositing a metal layer, such as titanium, cobalt, nickel, tungsten, or the like, over the device, including the exposed surfaces of the source/drain epitaxial structures 120 and then annealing the metal layer such that the metal layer is able to react with the source/drain epitaxial structures 120 to form silicide regions 160, and removing the non-reacted metal layer. Afterwards, a conductive material 162 is deposited, in which a single layer or a multi-layer (including a plurality of conductive layer) is formed. Next, a planarization step such as CMP is performed to remove excess material of the conductive material 162, to planarize the top surface of the device. The dummy gate SAC cap 238a is formed by the high etch resistant material (e.g., Si, W, WC, metal oxide) and thus would not be damaged during planarizing the conductive material 162. The remaining portion of the conductive material 162 refers to source/drain contacts 162a. A resulting structure is shown in FIGS. 29A-29C.

In FIGS. 30A-30C, the dummy gate SAC caps 238a are removed in an etching step(s), so that recesses 176 are formed. The recesses 176 allow for subsequently formed replacement gate SAC caps 338a to be formed within the recesses 176 to protect the replacement gate structures 126. Each of the recesses 176 are defined by the exposed inner surfaces 118S of the gate spacers 118 and the recessed top surfaces 126S of the replacement gate structures 126, respectively. Reference is made to FIGS. 31A-31C. The material of the replacement gate SAC cap 338a is different from the material of the dummy gate SAC caps 238a in some embodiments. The replacement gate SAC cap 338a is a dielectric material (e.g., phosphosilicate glass (PSG), $SiO_2$, SiN, SiOC, SiBN, SiOCN, BN or low-k material) formed using a low sticking coefficient intermedium (e.g., a silicon-containing precursor or the like) which is less about than 0.05, thereby allowing the precursors to penetrate deep into the recesses 176. The replacement gate SAC caps 338a are formed by a non-conformal deposition process (e.g., bottom-up deposition or flowable deposition or cyclic deposition-etch back or cyclic deposition-sputter back process). In some embodiments, the replacement gate SAC cap 338a is formed by bottom-up deposition process using an inductively coupled plasma (ICP) chemical vapor deposition (CVD) tool or a high density plasma CVD (HDP-CVD) tool. In some other embodiments, the replacement gate SAC cap 338a is formed by a flowable chemical vapor deposition (FCVD) process using a plasma enhanced CVD (PECVD) tool. The bottom-up deposition or flowable deposition or cyclic deposition-etch back or cyclic deposition-sputter back process can prevent unwanted seams and/or voids resulting from conformal deposition. In some embodiments, deposition of the replacement gate SAC cap 338a results in a multi-layer stack of the replacement gate SAC cap 338a, which includes, for example, a first layer L4a, a second layer L4b over the first layer L4a, a third layer L4c over the second layer L4b, and a fourth layer L4d over the third layer L4c. The multi-layer numbers is dependent on process, and interfaces between adjacent two of the first layer can be observed using, for example, transmission electron microscopy (TEM) in the bottom-up deposition or cyclic deposition-etch back or cyclic deposition-sputter back process.

An etch stop layer (ESL) 168 and a second ILD layer 170 are subsequently formed over the structure of FIGS. 31A-31C. Then, a patterning operation is performed to form via holes through the second ILD layer 170, the etch stop layer 168 and the replacement gate SAC cap 338a. The via holes are filed with one or more conductive materials so as to form via plugs 172, 174 over the source/drain contact 162a and the replacement gate structure 126, respectively, as shown in FIGS. 32A-32C. The via plugs 172, 174 may provide interconnection to one or more of the interconnect layers of a multilayer interconnect (MLI). The via plugs 172, 174 may include tungsten or other suitable conductive element. The via plug 172 can be referred to as source/drain via because it is formed over the source/drain contact 162a, and the via plug 174 can be referred to as a gate via because it is formed over the gate structure 126. It is understood that the IC structure 10b shown in FIGS. 32A-32C undergoes further CMOS processes to form various features such as interconnect metal layers, dielectric layers, passivation layers, etc.

Based on the above discussion, it can be seen that the present disclosure offers advantages. It is understood, however, that other embodiments may offer additional advantages, and not all advantages are necessarily disclosed herein. Moreover, no particular advantage is required for all embodiments. One advantage is that unwanted seams and/or voids to be formed within the gate cap material or the contact cap material resulting from conformal deposition can be prevented. Another advantage is that such prevention allows for an improved yield because of preventing source/drain contacts-to-replacement gate structure bridge.

In some embodiments, a method of forming a semiconductor device includes forming a dummy gate structure across a fin protruding from a substrate, forming gate spacers on opposite sidewalls of the dummy gate structure, forming source/drain epitaxial structures on opposite sides of the dummy gate structure, forming a first interlayer dielectric (ILD) layer on the source/drain epitaxial structures and outer sidewalls of the gate spacers, replacing the dummy gate structure with a replacement gate structure, etching back the replacement gate structure to form a recess between the gate spacers, performing a first non-conformal deposition process to fill the recess with a first gate cap material, and planarizing the first gate cap material to remove a portion of the first gate cap material outside the recess. In some embodiments, the first non-conformal deposition process is an inductively coupled plasma (ICP) chemical vapor deposition (CVD) process or a high density plasma CVD (HDP-CVD) process. In some embodiments, the first non-conformal deposition process is a flowable chemical vapor deposition (FCVD) process. In some embodiments, the first non-conformal deposition process is a cyclic deposition-etch back process. In some embodiments, the first non-conformal deposition process is a cyclic deposition-sputter back process. In some embodiments, the first non-conformal deposition process is performed such that the first gate cap material is void-free. In some embodiments, the first non-conformal deposition process results in that the first gate cap material has an inner interface within the first gate cap material. In some embodiments, the first non-conformal deposition process results in that the first gate cap material have non-uniformity in density. In some embodiments, the method further includes forming source/drain contacts over the source/drain epitaxial structures, and after forming the source/drain contacts, replacing the first gate cap material with a second gate cap material. In some embodiments, the second gate cap material is formed using a second non-conformal deposition process. In some embodiments, the second non-conformal deposition process is an inductively coupled plasma (ICP) chemical vapor deposition (CVD) process or a high density plasma CVD (HDP-CVD) process. In some embodiments, the second non-conformal deposition process is a flowable chemical vapor deposition (FCVD) process. In some embodiments, the first non-conformal deposition process is a cyclic deposition-etch back process. In some embodiments, the first non-conformal deposition process is a cyclic deposition-sputter back process. In some embodiments, the second non-conformal deposition process is performed such that the second gate cap material is void-free. In some embodiments, the second non-conformal deposition process results in that the second gate cap material has an inner interface within the second gate cap material. In some embodiments, the first gate cap material and the second gate cap material are different.

In some embodiments, a method of forming a semiconductor device includes forming a dummy gate structure across a fin protruding from a substrate, forming gate spacers on opposite sidewalls of the dummy gate structure, forming source/drain epitaxial structures on opposite sides of the dummy gate structure, forming a first interlayer dielectric (ILD) layer on the source/drain epitaxial structures and sidewalls of the gate spacers, replacing the dummy gate structure with a replacement gate structure, recessing the replacement gate structure to form a first recess, forming a gate cap within the first recess, forming source/drain contacts in the first ILD layer and over the source/drain epitaxial structures, recessing the source/drain contacts to form second recesses, performing a non-conformal deposition process to fill the second recesses with a contact cap material, and planarizing the contact cap material to remove a portion of the contact cap material outside the second recesses. In some embodiments, the non-conformal deposition process is an inductively coupled plasma (ICP) chemical vapor deposition (CVD) process, a high density plasma CVD (HDP-CVD) process, or a flowable chemical vapor deposition (FCVD) process. In some embodiments, the first non-conformal deposition process is a cyclic deposition-etch back process. In some embodiments, the first non-conformal deposition process is a cyclic deposition-sputter back process. In some embodiments, the non-conformal deposition process results in density non-uniformity in the contact cap material.

In some embodiments, a semiconductor device includes a substrate, a fin protruding from the substrate, a gate structure across the fin, source/drain epitaxial structures on opposite sides of the gate structure, source/drain contacts over the source/drain epitaxial structures, respectively, and a dielectric cap over the gate structure or one of the source/drain contacts. The dielectric cap is made of a single continuous material having an inner interface having a U-shape like cross section or V-shape like cross section. In some embodiments, the dielectric cap has non-uniformity in density. In some embodiments, a lower portion of the single continuous material below the inner interface has side portions with a thickness increasing in a direction toward the gate structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, comprising:
   forming a dummy gate structure across a fin protruding from a substrate;
   forming gate spacers on opposite sidewalls of the dummy gate structure;
   forming source/drain epitaxial structures on opposite sides of the dummy gate structure;
   forming a first interlayer dielectric (ILD) layer on the source/drain epitaxial structures and outer sidewalls of the gate spacers;
   replacing the dummy gate structure with a replacement gate structure;
   etching back the replacement gate structure to form a recess between the gate spacers;
   performing a first non-conformal deposition process to fill the recess with a first gate cap material; and
   planarizing the first gate cap material to remove a portion of the first gate cap material outside the recess.

2. The method of claim 1, wherein the first non-conformal deposition process is an inductively coupled plasma (ICP) chemical vapor deposition (CVD) process or a high density plasma CVD (HDP-CVD) process.

3. The method of claim 2, wherein the first non-conformal deposition process is a flowable chemical vapor deposition (FCVD) process.

4. The method of claim 1, wherein the first non-conformal deposition process is performed such that the first gate cap material is void-free.

5. The method of claim 1, wherein the first non-conformal deposition process results in that the first gate cap material has an inner interface within the first gate cap material.

6. The method of claim 1, wherein the first non-conformal deposition process is a cyclic deposition-etch back process or a cyclic deposition-sputter back process.

7. The method of claim 1, wherein the first non-conformal deposition process results in that the first gate cap material have non-uniformity in density.

8. The method of claim 1, further comprising:
   forming source/drain contacts over the source/drain epitaxial structures; and
   after forming the source/drain contacts, replacing the first gate cap material with a second gate cap material.

9. The method of claim 8, wherein the second gate cap material is formed using a second non-conformal deposition process.

10. The method of claim 9, wherein the second non-conformal deposition process is an inductively coupled plasma (ICP) chemical vapor deposition (CVD) process or a high density plasma CVD (HDP-CVD) process.

11. The method of claim 9, wherein the second non-conformal deposition process is a flowable chemical vapor deposition (FCVD) process.

12. The method of claim 9, wherein the second non-conformal deposition process is performed such that the second gate cap material is void-free.

13. The method of claim 9, wherein the second non-conformal deposition process results in that the second gate cap material has an inner interface within the second gate cap material.

14. The method of claim 8, wherein the first gate cap material and the second gate cap material are different.

15. A method of forming a semiconductor device, comprising:
   forming a dummy gate structure across a fin protruding from a substrate;
   forming gate spacers on opposite sidewalls of the dummy gate structure;
   forming source/drain epitaxial structures on opposite sides of the dummy gate structure;
   forming a first interlayer dielectric (ILD) layer on the source/drain epitaxial structures and sidewalls of the gate spacers;
   replacing the dummy gate structure with a replacement gate structure;
   recessing the replacement gate structure to form a first recess;
   forming a gate cap within the first recess;
   forming source/drain contacts in the first ILD layer and over the source/drain epitaxial structures;
   recessing the source/drain contacts to form second recesses;
   performing a non-conformal deposition process to fill the second recesses with a contact cap material; and
   planarizing the contact cap material to remove a portion of the contact cap material outside the second recesses.

16. The method of claim 15, wherein the non-conformal deposition process is an inductively coupled plasma (ICP) chemical vapor deposition (CVD) process, a high density plasma CVD (HDP-CVD) process, or a flowable chemical vapor deposition (FCVD) process.

17. The method of claim 15, wherein the non-conformal deposition process results in density non-uniformity in the contact cap material.

18. A method of forming a semiconductor device, comprising:
   forming a fin protruding from a substrate;
   forming a gate structure across the fin;
   forming source/drain epitaxial structures on opposite sides of the gate structure;
   forming source/drain contacts over the source/drain epitaxial structures, respectively; and
   forming a dielectric cap over the gate structure or one of the source/drain contacts, wherein the dielectric cap is made of a single continuous material having an inner interface having a U-shape like cross section, a lower portion of the single continuous material below the inner interface has side portions with a thickness increasing in a direction toward the gate structure.

19. The method of claim 18, wherein the dielectric cap has non-uniformity in density.

20. The method of claim 18, wherein forming the dielectric cap over the gate structure or the one of the source/drain contacts comprises:
   performing a bottom-up deposition process using an inductively coupled plasma (ICP) chemical vapor deposition (CVD) tool to form the dielectric cap.

* * * * *